(12) United States Patent
Forrest et al.

(10) Patent No.: US 9,666,822 B2
(45) Date of Patent: May 30, 2017

(54) EXTENDED OLED OPERATIONAL LIFETIME THROUGH PHOSPHORESCENT DOPANT PROFILE MANAGEMENT

(71) Applicant: The Regents of the University of Michigan, Ann Arbor, MI (US)

(72) Inventors: Stephen R. Forrest, Ann Arbor, MI (US); Yifan Zhang, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/537,414

(22) Filed: Nov. 10, 2014

(65) Prior Publication Data
US 2015/0171359 A1    Jun. 18, 2015

Related U.S. Application Data

(60) Provisional application No. 62/040,019, filed on Aug. 21, 2014, provisional application No. 61/974,789, filed on Apr. 3, 2014, provisional application No. 61/929,354, filed on Jan. 20, 2014, provisional application No. 61/916,914, filed on Dec. 17, 2013.

(51) Int. Cl.
*H01L 33/02* (2010.01)
*H01L 51/50* (2006.01)
*H01L 51/00* (2006.01)

(52) U.S. Cl.
CPC ...... *H01L 51/5024* (2013.01); *H01L 51/0072* (2013.01); *H01L 51/0085* (2013.01); *H01L 51/5004* (2013.01); *H01L 51/5016* (2013.01); *H01L 51/5072* (2013.01); *H01L 51/5088* (2013.01); *H01L 2251/5346* (2013.01); *H01L 2251/5384* (2013.01)

(58) Field of Classification Search
CPC .......................... H01L 51/508; H01L 51/5076
USPC .............................................. 257/40, 71, 72
See application file for complete search history.

(56) References Cited

U.S. PATENT DOCUMENTS

| 4,769,292 A | 9/1988 | Tang et al. |
| 5,247,190 A | 9/1993 | Friend et al. |
| 5,389,797 A | 2/1995 | Bryan et al. |
| 5,674,636 A | 10/1997 | Dodabalapur et al. |

(Continued)

FOREIGN PATENT DOCUMENTS

| WO | 2005038945 | 4/2005 |
| WO | 2009061922 | 5/2009 |
| WO | 2009061926 | 5/2009 |

OTHER PUBLICATIONS

Dictionary.com, definition of gradient, downloaded May 4, 2016.*

(Continued)

*Primary Examiner* — Michael Lebentritt
(74) *Attorney, Agent, or Firm* — Riverside Law LLP

(57) ABSTRACT

This disclosure relates, at least in part, an organic light emitting device, which in some embodiments comprises an anode; a cathode; a first emissive layer disposed between the anode and the cathode, the first emissive layer comprising an electron transporting compound and a phosphorescent emissive dopant compound; and wherein the phosphorescent emissive dopant compound has a concentration gradient, in the emissive layer, which varies from the cathode side of the first emissive layer to the anode side of the emissive layer.

16 Claims, 30 Drawing Sheets

(56) References Cited

U.S. PATENT DOCUMENTS

| | | | |
|---|---|---|---|
| 5,683,823 A | 11/1997 | Shi et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,892,786 A | 4/1999 | Lott | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,468,819 B1 | 10/2002 | Kim et al. | |
| 6,548,956 B2 | 4/2003 | Forrest et al. | |
| 6,576,134 B1 | 6/2003 | Agner et al. | |
| 6,602,540 B2 | 8/2003 | Gu et al. | |
| 7,431,968 B1 | 10/2008 | Shtein et al. | |
| 7,507,486 B2 | 3/2009 | Ren | |
| 7,525,129 B2 | 4/2009 | Masuda et al. | |
| 7,528,810 B2 | 5/2009 | Ohshima et al. | |
| 7,551,660 B2 | 6/2009 | Lutgen | |
| 7,572,522 B2* | 8/2009 | Seo et al. | 428/690 |
| 7,696,681 B2 | 4/2010 | Park | |
| 7,768,194 B2 | 8/2010 | Forrest et al. | |
| 7,943,202 B2 | 5/2011 | Chui et al. | |
| 8,106,581 B2 | 1/2012 | Okada et al. | |
| 8,178,217 B2 | 5/2012 | Nomura et al. | |
| 8,253,157 B2 | 8/2012 | Jorgenson | |
| 8,362,691 B2 | 1/2013 | Kinoshita et al. | |
| 8,513,658 B2 | 8/2013 | D'Andrade et al. | |
| 8,557,399 B2 | 10/2013 | D'Andrade et al. | |
| 8,674,348 B2* | 3/2014 | Seo et al. | 257/40 |
| 2002/0034656 A1 | 3/2002 | Thompson et al. | |
| 2002/0055015 A1 | 5/2002 | Sato et al. | |
| 2002/0182441 A1 | 12/2002 | Lamansky et al. | |
| 2003/0068528 A1 | 4/2003 | Thompson et al. | |
| 2003/0072964 A1 | 4/2003 | Kwong et al. | |
| 2003/0175553 A1 | 9/2003 | Thompson et al. | |
| 2003/0189401 A1 | 10/2003 | Kido et al. | |
| 2003/0230980 A1 | 12/2003 | Forrest et al. | |
| 2003/0234607 A1* | 12/2003 | Kim | C09K 11/06 313/502 |
| 2004/0174116 A1 | 9/2004 | Lu et al. | |
| 2005/0029933 A1 | 2/2005 | Liao et al. | |
| 2005/0046337 A1* | 3/2005 | Chin et al. | 313/504 |
| 2005/0074629 A1 | 4/2005 | Forrest et al. | |
| 2005/0093440 A1* | 5/2005 | Uhlig et al. | 313/506 |
| 2005/0110398 A1 | 5/2005 | Lee | |
| 2005/0140275 A1 | 6/2005 | Park | |
| 2005/0164033 A1 | 7/2005 | Chin et al. | |
| 2005/0168137 A1* | 8/2005 | Adamovich et al. | 313/504 |
| 2005/0249973 A1* | 11/2005 | Kim | C09K 11/06 428/690 |
| 2005/0264174 A1 | 12/2005 | Liao et al. | |
| 2006/0087225 A1 | 4/2006 | Liao et al. | |
| 2006/0157696 A1 | 7/2006 | Katoda | |
| 2006/0186796 A1 | 8/2006 | Yabe et al. | |
| 2006/0232194 A1 | 10/2006 | Tung et al. | |
| 2006/0280964 A1 | 12/2006 | Liu | |
| 2007/0116983 A1 | 5/2007 | Kanno et al. | |
| 2008/0007165 A1 | 1/2008 | Suzuki et al. | |
| 2008/0102310 A1 | 5/2008 | Thompson et al. | |
| 2008/0171226 A1 | 7/2008 | Noh et al. | |
| 2008/0265751 A1* | 10/2008 | Smith et al. | 313/504 |
| 2008/0312437 A1 | 12/2008 | Inoue et al. | |
| 2009/0033212 A1 | 2/2009 | Ahn et al. | |
| 2009/0121621 A1 | 5/2009 | Andrade | |
| 2009/0174311 A1* | 7/2009 | Patel et al. | 313/504 |
| 2009/0278444 A1 | 11/2009 | Forrest et al. | |
| 2009/0284134 A1 | 11/2009 | Iida et al. | |
| 2010/0045174 A1 | 2/2010 | Okabe et al. | |
| 2013/0112949 A1* | 5/2013 | Sim et al. | 257/40 |
| 2014/0070178 A1* | 3/2014 | Lee et al. | 257/40 |
| 2014/0239285 A1* | 8/2014 | Wang | 257/40 |
| 2015/0090973 A1 | 4/2015 | Forrest et al. | |

OTHER PUBLICATIONS

Celebi et al., "Simplified calculation of dipole energy transport in a multilayer stack using dyadic Green's functions," Optics Express, vol. 15, No. 4, pp. 1762-1772 (2007).

Kanno et al., "White stacked electrophosphorescent organic light-emitting devices employing MoO3 as a charge-generation layer," Advanced Materials, vol. 18, pp. 339-342 (2006).

Forrest et al., "Measuring the efficiency of organic light-emitting devices," Advanced Materials, vol. 15, No. 13, pp. 1043-1048 (2003).

Holmes et al., Blue organic electrophosphorescence using exothermic host-guest energy transfer, Applied Physics Letters, vol. 82, No. 15, pp. 2422-2424 (2003).

Giebink et al., "Direct evidence for degradation of polaron excited states in organic light emitting diodes," Journal of Applied Physics, vol. 105, 124514, pp. 124514-124517 (2009).

Wang et al., "Degradation of organic/organic interfaces in organic light-emitting devices due to polaron-exciton Interactions ACS Applied Materials and Interfaces," vol. 5, pp. 8733-8739 (2013).

Forrest et al., "The stacked OLED (SOLED): a new type of organic device for achieving high-resolution full-color displays," Synthetic Metals, vol. 91, pp. 9-13 (1997).

Cho et al., "Microcavity two-unit tandem organic light-emitting devices having a high efficiency," Applied Physics Letters, vol. 88, 111106, pp. 111106-111108 (2006).

Baldo et al., "Highly efficient phosphorescent emission from organic electroluminescent devices," Nature, vol. 395, pp. 151-154 (1998).

Baldo et al., "Very high-efficiency green organic light-emitting devices based on electrophosphorescence," Applied Physics Letters, vol. 75, No. 1, pp. 4-6 (1999).

Giebink et al. "Intrinsic luminance loss in phosphorescent small-molecule organic light emitting devices due to bimolecular annihilation reactions," Journal of Applied Physics, vol. 103, 044509, pp. 044509-044517 (2008).

Fery et al., "Physical mechanism responsible for the stretched exponential decay behavior of aging organic light-emitting diodes," Applied Physics Letters, Vol. 87, 213502, pp. 213502-213504 (2005).

Lee et al., "Effects of mixed host spatial distribution on the efficiency of blue phosphorescent organic light-emitting diodes," Applied Physics Letters, vol. 101, 043303-043305 (2012).

Lee, Jun Yeob, "Charge trapping effect in phosphorescent organic light-emitting diodes," Molecular Crystals and Liquid Crystals, vol. 498, pp. 131-139 (2009).

Lei et al., "Improved performance of electrophosphorescent organic light-emitting diode by graded doped emissive layer," Japanese Journal of Applied Physics, vol. 43, No. 9A/B, pp. 1226-1228 (2004).

* cited by examiner

US 9,666,822 B2

EXTENDED OLED OPERATIONAL LIFETIME THROUGH PHOSPHORESCENT DOPANT PROFILE MANAGEMENT

CROSS-REFERENCE TO RELATED APPLICATIONS

This application claims priority to, and the benefit of, U.S. Provisional Patent Application No. 61/916,914 filed Dec. 17, 2013; U.S. Provisional Patent Application No. 61/929,354 filed Jan. 20, 2014; U.S. Provisional Patent Application No. 61/974,789 filed Apr. 3, 2014; and U.S. Provisional Patent Application No. 62/040,019 filed Aug. 21, 2014, all of which are incorporated herein by reference herein in their entireties.

STATEMENT REGARDING FEDERALLY SPONSORED RESEARCH OR DEVELOPMENT

This invention was made with U.S. Government support under Contract No. DE-SC0001013-sub-K113153 awarded by the Department of Energy. The government may have certain rights in this invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDS) having exciton density uniformly distributed across an emissive layer.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Organic Light Emitting Diodes (OLEDs), as reported by Tang, C. & VanSlyke, S. Organic electroluminescent diodes. Appl. Phys. Lett. 51, 913 (1987), are a primary driving force in the current information display revolution. For example, OLED displays have been proven successful in mobile devices and more recently in televisions and lighting as reported by National Research Council, Assessment of Advanced Solid-State Lighting. (The National Academies Press, 2013) and Chung, H.-K. The Challenges and Opportunities of Large OLED TVs, *SID Information Display* 29, 4 (2013). Among the advantages of OLEDs, power consumption and operational lifetime are two primary figures-of-merit. Due to their high efficiency, phosphorescent OLEDs (PHOLEDs) as reported by Baldo, M. A., O'Brien, D. F., You, Y., Shoustikov, A., Sibley, S., Thompson, M. E. & Forrest, S. R. Highly efficient phosphorescent emission from organic electroluminescent devices, *Nature* 395, 151-154 (1998), have a significantly lower power consumption than fluorescent OLEDs. Unfortunately, the blue sub-pixels in OLED displays employ fluorescent OLEDs due to the short operational lifetime in analogous PHOLEDs as reported by Tsujimura, T. OLED Displays: Fundamentals and Applications. (John Wiley & Sons, Inc., 2012). Previously, it has been suggested that the energy-driven annihilation between a triplet exciton (or spin symmetric molecular excited state) on the phosphorescent dopant and a polaron (or free electron) on the conductive host is the primary source of intrinsic degradation in blue PHOLEDs (Giebink, N. C., D'Andrade, B. W., Weaver, M. S., Mackenzie, P. B., Brown, J. J., Thompson, M. E. & Forrest, S. R., Intrinsic luminance loss in phosphorescent small-molecule organic light emitting devices due to bimolecular annihilation reactions, *J. Appl. Phys.* 103 (2008); and Giebink, N., DAndrade, B., Weaver, M., Brown, J. & Forrest, S., Direct evidence for degradation of polaron excited states in organic light emitting diodes, *J. Appl. Phy.* 105, 124514-124517 (2009)). That is, the collision of the high energy (blue) exciton with a negatively charged (electron) polaron can result in dissipation of their combined energies as high as 6 eV onto a molecular bond, thereby decomposing the material.

SUMMARY OF THE INVENTION

In one aspect the present invention provides an organic light emitting device. In one embodiment, the organic light emitting device comprises an anode; a cathode; a first emissive layer disposed between the anode and the cathode. In one embodiment, the first emissive layer comprises an electron transporting compound and a phosphorescent emissive dopant compound. In one embodiment, the phosphorescent emissive dopant compound has a concentration gradient, in the emissive layer, which varies from the cathode side of the first emissive layer to the anode side of the emissive layer.

In some embodiments, the organic light emitting device of the present invention includes a first emissive layer comprising an electron transporting compound and a phosphorescent emissive dopant compound, wherein the phosphorescent emissive dopant compound has a concentration gradient, in the emissive layer, wherein the concentration gradient varies linearly towards the cathode side of the first emissive layer. In some embodiments, the concentration gradient varies non-linearly towards the cathode side of the first emissive layer. In some such embodiments, the non-linearity corresponds to a polynomial function selected from the group consisting of a quadratic function, a cubic function, or a higher order function.

In some embodiments, the concentration gradient varies in a step wise form, wherein the phosphorescent emissive dopant compound is dispersed in the emissive layer as a plurality of high concentration dopant regions and as a plurality of low concentration dopant regions. In some embodiments, the concentration gradient varies in a step wise form, wherein the phosphorescent emissive dopant compound is dispersed in the emissive layer as a plurality of first dopant regions and as a plurality of second dopant regions, wherein the first dopant regions are wider than the second dopant regions.

In some embodiments of the organic light emitting device of the present invention, the emissive layer further comprises a second electron transporting compound. In some such embodiments, the phosphorescent emissive dopant compound has a HOMO energy level at least 0.5 eV lower than a HOMO level of the second electron transporting compound.

In some embodiments of the organic light emitting device of the present invention, the organic light emitting device further comprises a hole injection layer disposed between the anode and the emissive layer. In some embodiments, the hole injection layer and the emissive layer have a combined thickness, and wherein the emissive layer has a thickness which is at least 60% of the combined thickness. In some embodiments, the emissive layer has a thickness ranging from 10 nm to 150 nm.

In some embodiments of the organic light emitting device of the present invention, the organic light emitting device does not include a hole injection layer disposed between the anode and the emissive layer.

In some embodiments of the organic light emitting device of the present invention, exciton density is uniformly distributed across the emissive layer compared to an equivalent device that has a uniform concentration of the phosphorescent emissive dopant compound in the emissive layer. In some embodiments of the organic light emitting device of the present invention, the concentration gradient decreases from the cathode side of the first emissive layer to the anode side of the emissive layer. In some embodiments of the organic light emitting device of the present invention, the concentration gradient increases from the cathode side of the first emissive layer to the anode side of the emissive layer. In some embodiments of the organic light emitting device of the present invention, the electron transport is performed primarily by the electron transporting compound. In some embodiments of the organic light emitting device of the present invention, hole transport is performed primarily by the phosphorescent emissive dopant compound.

In some embodiments of the organic light emitting device of the present invention, the organic light emitting device further comprises an electron transport layer disposed between the cathode and the emissive layer.

In some embodiments of the organic light emitting device of the present invention, the organic light emitting device has an external quantum efficiency of at least 10% higher compared to an equivalent device that has a uniform concentration of the phosphorescent emissive dopant compound in the emissive layer.

In some embodiments of the organic light emitting device of the present invention, the organic light emitting device exhibits a time to degrade to 80% of an initial luminance value of 1000 cd/m$^2$ that is at least 3.5 times greater than an equivalent device that has a uniform concentration of the phosphorescent emissive dopant compound in the emissive layer.

In another aspect, the present invention provides an organic light emitting device comprising: an anode; a cathode; a first emissive layer disposed between the anode and the cathode; and a second emissive layer disposed between the first emissive layer and the cathode. In some embodiments, the first emissive layer comprises a first electron transporting compound and a first phosphorescent emissive dopant compound. In some embodiments, the second emissive layer is disposed between the first emissive layer and the cathode. In some embodiments, the organic light emitting device includes an interconnecting layer disposed between the first emissive layer and the second emissive layer. In some embodiments, the second emissive layer comprises a second electron transporting compound and a second phosphorescent emissive dopant compound. In some embodiments, the first phosphorescent emissive dopant compound has a first concentration gradient which varies from the cathode side of the first emissive layer to the anode side of the emissive layer and the second phosphorescent emissive dopant compound has a second concentration gradient which varies from the cathode side of the second emissive layer to the anode side of the second emissive layer. In some embodiments, the first concentration gradient differs from the second concentration gradient. In some embodiments, the first concentration gradient is the same as the second concentration gradient. In some embodiments, the first concentration gradient varies either linearly towards the cathode side of the first emissive layer. In some embodiments, the first concentration gradient varies non-linearly towards the cathode side of the first emissive layer. In some embodiments, the first concentration gradient varies non-linearly towards the cathode side of the first emissive layer, wherein the non-linearity corresponds to a sinusoidal function, a polynomial function selected from the group consisting of a quadratic function, a cubic function, or a higher order function.

In some embodiments of the organic light emitting device of the present invention, the organic light emitting device includes a second concentration gradient that varies linearly towards the cathode side of the second emissive layer. In some embodiments, the organic light emitting device includes a second concentration gradient that varies non-linearly towards the cathode side of the first emissive layer. In some embodiments, the organic light emitting device includes a second concentration gradient that varies on-linearly towards the cathode side of the first emissive layer, wherein the non-linearity corresponds to a sinusoidal function, a polynomial function selected from the group consisting of a quadratic function, a cubic function, or a higher order function.

In some embodiments of the organic light emitting device of the present invention, the first concentration gradient varies in a step wise form, wherein the first phosphorescent emissive dopant compound is dispersed in the first emissive layer as a first plurality of high concentration dopant regions and in the first emissive layer as a first plurality of low concentration dopant regions. In some embodiments of the organic light emitting device of the present invention, the second concentration gradient varies in a step wise form, wherein the second phosphorescent emissive dopant compound is dispersed in the second emissive layer as a second plurality of high concentration dopant regions and dispersed in the second emissive layer as a second plurality of low concentration dopant regions. In some embodiments of the organic light emitting device of the present invention, the first concentration gradient decreases from the cathode side of the first emissive layer to the anode side of the emissive layer. In some embodiments of the organic light emitting device of the present invention, the first concentration gradient increases from the cathode side of the first emissive layer to the anode side of the emissive layer. In some embodiments of the organic light emitting device of the present invention, the second concentration gradient increases from the cathode side of the first emissive layer to the anode side of the emissive layer. In some embodiments of the organic light emitting device of the present invention, the second concentration gradient decreases from the cathode side of the first emissive layer to the anode side of the emissive layer. In some embodiments of the organic light emitting device of the present invention, the first phosphorescent emissive dopant compound has a HOMO energy level at least 0.5 eV lower than a HOMO level of the first electron transporting compound. In some embodiments of the organic light emitting device of the present invention, the second phosphorescent emissive dopant compound has a HOMO energy level at least 0.5 eV lower than a HOMO level of the second electron transporting compound.

In some embodiments of the organic light emitting device of the present invention, the organic light emitting device further comprises at least one organic layer disposed between the anode and the first emissive layer. In some embodiments of the organic light emitting device of the present invention, the at least one organic layer and the first emissive layer have a combined thickness, wherein the first emissive layer has a thickness which is at least 60% of the combined thickness. In some embodiments of the organic light emitting device of the present invention, the first emissive layer has a thickness ranging from 10 nm to 150 nm. In some embodiments of the organic light emitting device of the present invention, the organic light emitting device has an exciton peak density occurring near a middle region of the first emissive layer. In some embodiments of the organic light emitting device of the present invention, the organic light emitting device has an exciton density that is uniformly distributed across the first emissive layer compared to an equivalent device that has a uniform concentration of the phosphorescent emissive dopant compound in the first emissive layer.

In some embodiments of the organic light emitting device of the present invention, the organic light emitting device further comprises an electron transport layer disposed between the cathode and the first emissive layer. In some embodiments of the organic light emitting device of the present invention, the organic light emitting device has a hole injection layer disposed between the first emissive layer and the anode. In some embodiments of the organic light emitting device of the present invention, the organic light emitting device does not have a hole injection layer disposed between the anode and the emissive layer.

In some embodiments of the organic light emitting device of the present invention, the organic light emitting device exhibits an external quantum efficiency of at least 10% higher compared to an equivalent device that has a uniform concentration of the first phosphorescent emissive dopant compound in the first emissive layer. In some embodiments of the organic light emitting device of the present invention, the organic light emitting device exhibits a time to degrade to 80% of an initial luminance value of 1000 cd/m$^2$ that is at least 3.5 times greater than an equivalent device that has a uniform concentration of the first phosphorescent emissive dopant compound in the first emissive layer.

In some preferred embodiments, the organic light emitting device of the present invention comprises an anode; a cathode; a first emissive layer disposed between the anode and the cathode, the first emissive layer comprising an electron transporting compound and a phosphorescent emissive dopant compound; and wherein the phosphorescent emissive dopant compound has a concentration gradient, in the emissive layer, which varies from the cathode side of the first emissive layer to the anode side of the emissive layer. In some embodiments of the organic light emitting device of the present invention, the phosphorescent emissive dopant compound has a HOMO energy level at least 0.5 eV lower than a HOMO level of the electron transporting compound.

DETAILED DESCRIPTION

Figure 1:
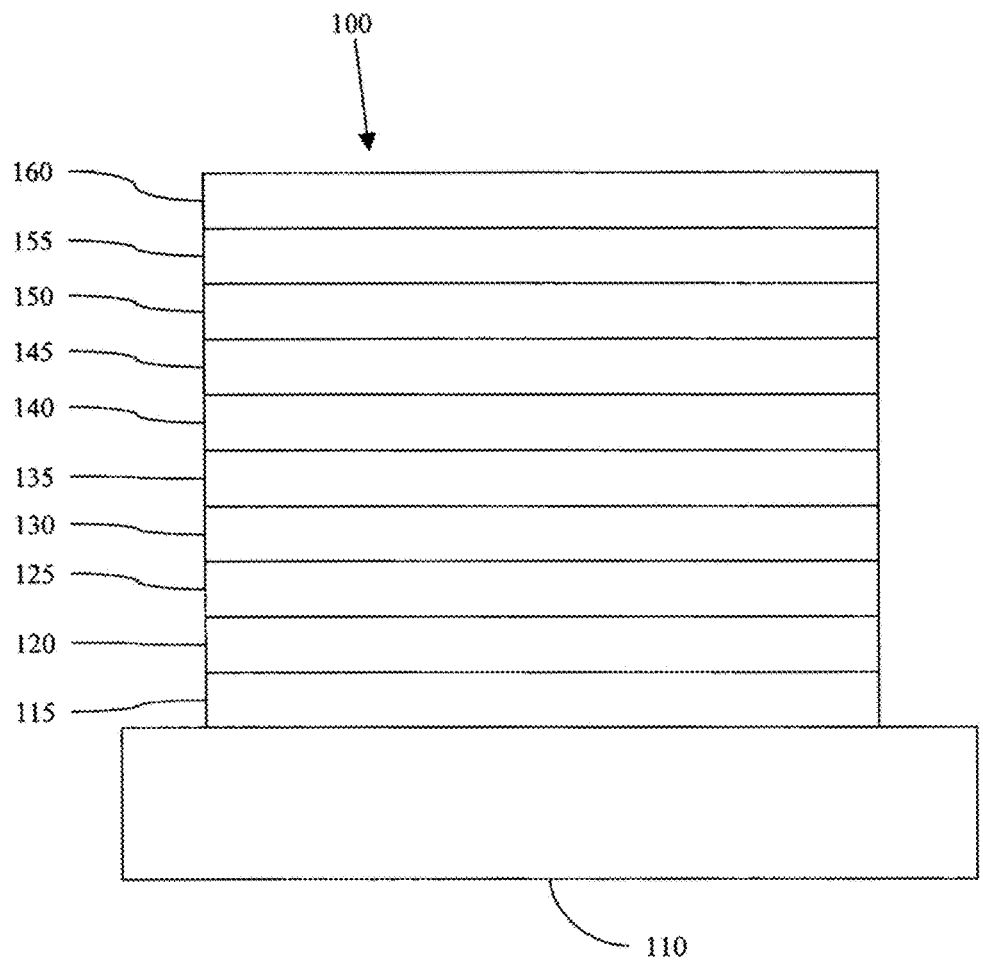
FIG. 1 shows a prior art organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238; 6,310,360; 6,830,828 and 6,835,469; U.S. Patent Application Publication No. 2002-0182441; and WO-02/074015.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

Following electron-hole recombination in an OLED, two types of excited states (or excitons), singlets and triplets, are formed with a ratio of 1:3 determined by quantum spin statistics as reported by Baldo, M. A., O'Brien, D. F., Thompson, M. E. & Forrest, S. R., Excitonic singlet-triplet ratio in a semiconducting organic thin film. *Phys. Rev. B* 60, 14422-14428 (1999). Fluorescent OLEDs rely on singlets for emission, and thus have an internal quantum efficiency (IQE) limit of 25%. Although triplet-triplet annihilation improves the IQE in fluorescent OLEDs beyond this limit, as reported by Kondakov, D. Y., Pawlik, T. D., Hatwar, T. K. & Spindler, J. P. Triplet annihilation exceeding spin statistical limit in highly efficient fluorescent organic light-emitting diodes, *J. Appl. Phys.* 106, 124510 (2009), its efficiency is far inferior to the routinely realized 100% IQE. (Adachi, C., Baldo, M. A., Thompson, M. E. & Forrest, S. R., Nearly 100% internal phosphorescence efficiency in an organic light-emitting device, *J. Appl. Phys.* 90, 5048-5051 (2001); Baldo, M. A., O'Brien, D. F., You, Y., Shoustikov, A., Sibley, S., Thompson, M. E. & Forrest, S. R., Highly efficient phosphorescent emission from organic electroluminescent devices. *Nature* 395, 151-154 (1998)). Besides high efficiency, long operational lifetime is essential for a technology to achieve commercial acceptance. After more than a decade of research, significant breakthroughs in the lifetime of green and red PHOLEDs have been achieved, with reported T50s for $L_0$=1000 cd/m$^2$ as long as $10^6$ hr. (Chwang, A. B., Kwong, R. C. & Brown, J. J., Graded mixed-layer organic light-emitting devices, *Appl. Phys. Lett.* 80, 725-727 (2002); Kwong, R. C., Nugent, M. R., Michalski, L., Ngo, T., Rajan, K., Tung, Y. J., Weaver, M. S., Zhou, T. X., Hack, M., Thompson, M. E., Forrest, S. R. & Brown, J. J., High operational stability of electrophosphorescent devices. *Appl. Phys. Lett.* 81, 162-164 (2002); Kim, S. H., Jang, J. & Lee, J. Y., Lifetime improvement of green phosphorescent organic light-emitting diodes by charge confining device structure. *Applied Physics Letters* 90, 203511-203511-203513 (2007); and Chin, B. D. & Lee, C., Confinement of charge carriers and excitons in electrophosphorescent devices: Mechanism of light emission and degradation. *Advanced Materials* 19, 2061-2066 (2007)). In contrast, progress in the improvement of blue PHOLED lifetime has been slow. For example, a T50 of only several hours at $L_0$=1000 cd/m$^2$ has been reported for a PHOLED with the blue emitting iridium (III) bis[(4,6-difluorophenyl)-pyridinato-N,C$^{2'}$]picolinate (FIrpic). (Holmes, R. J., Forrest, S. R., Tung, Y. J., Kwong, R. C., Brown, J. J., Garon, S. & Thompson, M. E., Blue organic electrophosphorescence using exothermic host-guest energy transfer, *Appl. Phys. Lett.* 82, 2422-2424 (2003); Seifert, R., de Moraes, I. R., Scholz, S., Gather, M. C., Lüssem, B. & Leo, K., Chemical degradation mechanisms of highly efficient blue phosphorescent emitters used for organic light emitting diodes, *Organic Electronics* (2012)). As a result, relatively inefficient blue fluorescent OLEDs remain dominant in OLED displays.

An intrinsic degradation mechanisms of OLEDs has been shown to result from energetically driven formation of non-radiative defects that can quench excitons as well as trap charges. (Giebink, N. C., D'Andrade, B. W., Weaver, M. S., Mackenzie, P. B., Brown, J. J., Thompson, M. E. and Forrest, S. R., Intrinsic luminance loss in phosphorescent small-molecule organic light emitting devices due to bimolecular annihilation reactions, *J. Appl. Phys.* 103 (2008) and Giebink, N., DAndrade, B., Weaver, M., Brown, J. and Forrest, S., Direct evidence for degradation of polaron excited states in organic light emitting diodes, *Journal of Applied Physics* 105, 124514-124514-124517 (2009)). In PHOLEDs, these defects are formed primarily due to bimolecular triplet-polaron annihilation where energy is transferred from triplets to polarons. This, in turn, results in a high energy polaron (typically twice the exciton energy) that, on thermalization, can break bonds on the molecule on which it resides. Due to their high triplet energy, excess energy dissipated through TPA in blue PHOLEDs is significantly higher than for red or green PHOLEDs, explaining the faster degradation in the former case. Furthermore, while blue fluorescent devices are by no means immune to this degradation path, the triplet lifetime of >1 μs greatly exceeds that of the singlet lifetime in fluorophores (<20 ns), and hence there is a proportionately greater opportunity for exciton-polaron annihilation events to occur in phosphorescent devices.

While little progress has been made since these fundamental mechanisms were identified, it is possible that a route to reduce degradation via TPA is to reduce the exciton density in the PHOLED exciton formation zone. Recently, Erickson and Holmes as reported by have demonstrated increased efficiency by the extension of exciton formation zone in a green PHOLED from 15 nm to >80 nm through graded mixing of electron and hole transporting host molecules. (Erickson, N. C. & Holmes, R. J., Investigating the Role of Emissive Layer Architecture on the Exciton Recombination Zone in Organic Light-Emitting Devices., *Adv. Funct. Mater.* (2013)). No lifetime data were reported in that work. Furthermore, the selection of stable host materials with high triplet energies for blue PHOLEDs is limited.

Here, we show that grading the dopant concentration in the emitting layer (EML) of a PHOLED significantly extends the lifetime of the device by extending the exciton formation zone. The width of the EML, and hence the device lifetime, is further extended by using sufficiently high dopant concentration, and with the dopant highest occupied molecular orbital level (HOMO) chosen below that of the host to allow for holes to conduct directly on the dopant. To our knowledge, this is the first report of an OLED with a graded doping profile where the concentration gradient affects the distribution of excitons within the EML, thus significantly impacting device operational lifetime.

FIG. 1 shows a prior art organic light emitting device 100. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164.

Figure 2:
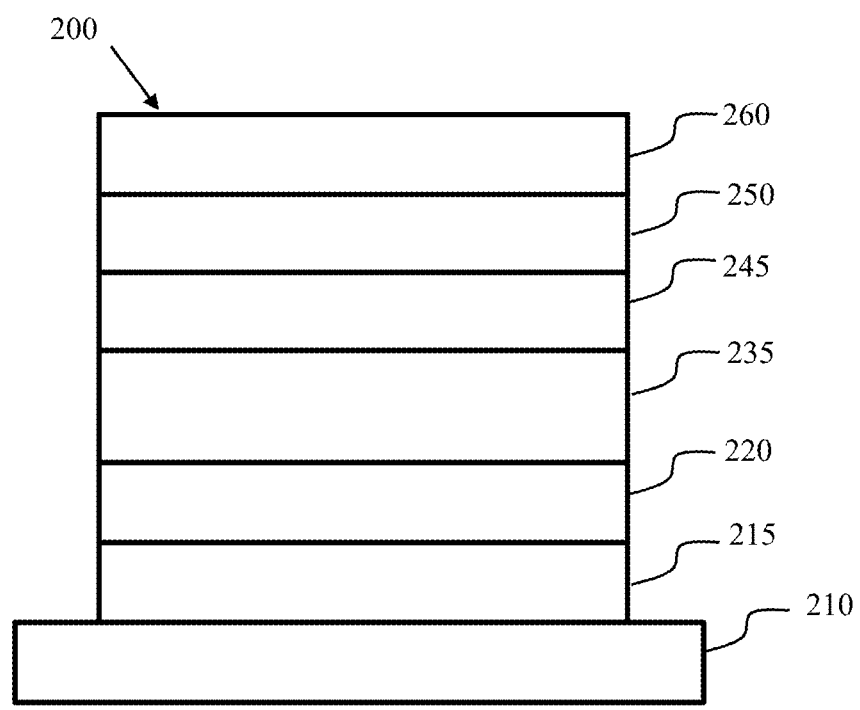
FIG. 2 shows an exemplary organic light emitting device having separate hole injection, electron transport, and emissive layers, as well as other layers.

FIG. 2 illustrates an exemplary organic light emitting device 200 according to the present disclosure. Device 200 may include a substrate 210, an anode 215, a hole injection layer 220, an emissive layer 235, an electron transport layer 245, an electron injection layer 250, and a cathode 260. In one embodiment of such exemplary organic light emitting device, the device does not have a hole transport layer disposed between the hole injection layer 220 and the emissive layer 235.

Figure 3:
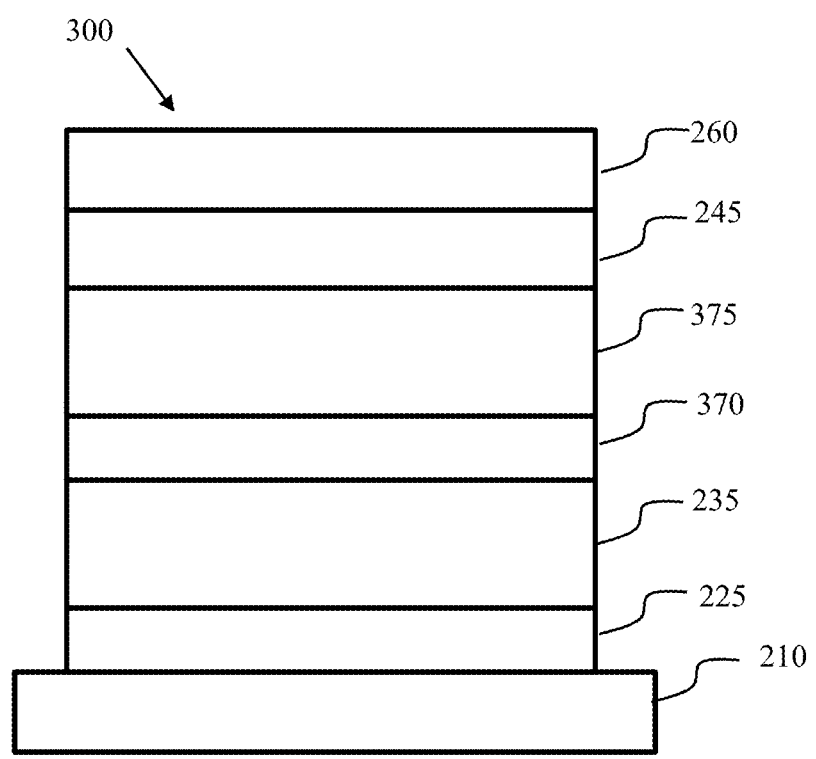
FIG. 3 shows an exemplary stacked OLED.

FIG. 3 illustrates a second exemplary organic light emitting device 300, a stacked organic light emitting device, according to the present disclosure. Device 300 may include an anode 225, a first emissive layer 335, an interconnecting layer 370, a second emissive layer 375 and a cathode 260. The interconnection layer 370 is disposed between the first emissive layer 335 and the second emissive layer 375. In one embodiment of such exemplary organic light emitting device, the device does not have a hole transport layer disposed adjacent to the first emissive layer 335 and/or the cathode 260 and the second emissive layer 375.

Substrate 210 may be any suitable substrate that provides desired structural properties. Substrate 210 may be flexible or rigid. Substrate 210 may be transparent, translucent or opaque. Plastic and glass are examples of preferred rigid substrate materials. Plastic and metal foils are examples of preferred flexible substrate materials. Substrate 210 may be a semiconductor material in order to facilitate the fabrication of circuitry. For example, substrate 210 may be a silicon wafer upon which circuits are fabricated, capable of controlling OLEDs subsequently deposited on the substrate. Other substrates may be used. The material and thickness of substrate 210 may be chosen to obtain desired structural and optical properties.

Anode 215 may be any suitable anode that is sufficiently conductive to transport holes to the organic layers. The material of anode 215 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 215 (and substrate 210) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 215 may be opaque and/or reflective. A reflective anode 215 may be preferred for some top-emitting devices, to increase the amount of light emitted from the top of the device. The material and thickness of anode 215 may be chosen to obtain desired conductive and optical properties. Where anode 215 is transparent, there may be a range of thickness for a particular material that is thick enough to provide the desired conductivity, yet thin enough to provide the desired degree of transparency. Other anode materials and structures may be used.

In one embodiment, the present invention provides for OLEDs having a concentration gradient of a phosphorescent dopant compound in the emissive layer which also contains an electron transport compound. Applicants have unexpectedly found that when the phosphorescent dopant compound has a concentration gradient, within the emissive layer, the exciton density is distributed across the emissive layer instead of have a peak exciton density at the interface of the emissive layer and electron transport layer. Such uniform exciton density results in longer OLED device lifetime, particularly for phosphorescent dopant compounds having a peak emissive wavelength less than 500 nm.

In one embodiment, the present invention provides for an organic light emitting device comprising: an anode; a cathode; a first emissive layer disposed between the anode and the cathode, the first emissive layer comprising an electron transporting compound and a phosphorescent emissive dopant compound having a concentration gradient, in the first emissive layer, which varies from the cathode side of the first emissive layer to the anode side of the emissive layer. In one aspect, the organic light emitting device may further comprise an electron transport layer disposed between the cathode and the first emissive layer. In some embodiments, electron transport is performed primarily by the electron transporting compound. In some embodiments, hole transport is performed primarily by the phosphorescent emissive dopant compound. In one embodiment, the device does not have a hole transport layer disposed adjacent to the emissive layer.

In one aspect, the organic light emitting device further comprises a hole injection layer disposed between the anode and the first emissive layer. In one such embodiment, the hole injection layer is adjacent to the first emissive layer. In one embodiment, the first emissive layer has a thickness which is at least 60% of the combined thickness of the hole injection layer and the first emissive layer. In one such embodiment, the first emissive layer has a thickness ranging from 10 nm to 150 nm.

In another embodiment, the present disclosure provides for a stacked organic light emitting device comprising an anode; a cathode; a first emissive layer disposed between the anode and the cathode, the first emissive layer comprising a first electron transporting compound and a first phosphorescent emissive dopant compound; a second emissive layer disposed between the first emissive layer and the cathode, wherein an interconnecting layer is disposed between the first emissive layer and the second emissive layer. The second emissive layer comprises a second electron transporting compound and a second phosphorescent emissive dopant compound. The first phosphorescent emissive dopant compound has a first concentration gradient which varies from the cathode side of the first emissive layer to the anode side of the emissive layer. The second phosphorescent emissive dopant compound has a second concentration gradient which varies from the cathode side of the second emissive layer to the anode side of the second emissive layer. In some embodiments of a stacked organic light emitting device, the device may comprise more than two emissive layers. In one embodiment, the device does not have a hole transport layer disposed adjacent to the first emissive layer and/or second emissive layer.

In one aspect, the stacked organic light emitting device further comprises a hole injection layer disposed between the anode and the first emissive layer. In one embodiment, the first emissive layer has a thickness which is at least 60% of the combined thickness of the hole injection layer and the emissive layer. In one such embodiment, the first emissive layer has a thickness ranging from 10 nm to 150 nm.

Such organic light emitting devices exhibit an exciton density that is uniformly distributed across the emissive layer compared to an equivalent device that has a uniform concentration of the phosphorescent emissive dopant compound in the emissive layer. Further, such organic light emitting devices may have an external quantum efficiency of at least 10% higher compared to an equivalent device that has a uniform concentration of the phosphorescent emissive dopant compound in the emissive layer. Further, the organic light emitting devices may exhibit a time to degrade to 80% of an initial luminance value of 1000 cd/m$^2$ that is at least 3.5 times greater than an equivalent device that has a uniform concentration of the phosphorescent emissive dopant compound in the emissive layer.

Figure 4:
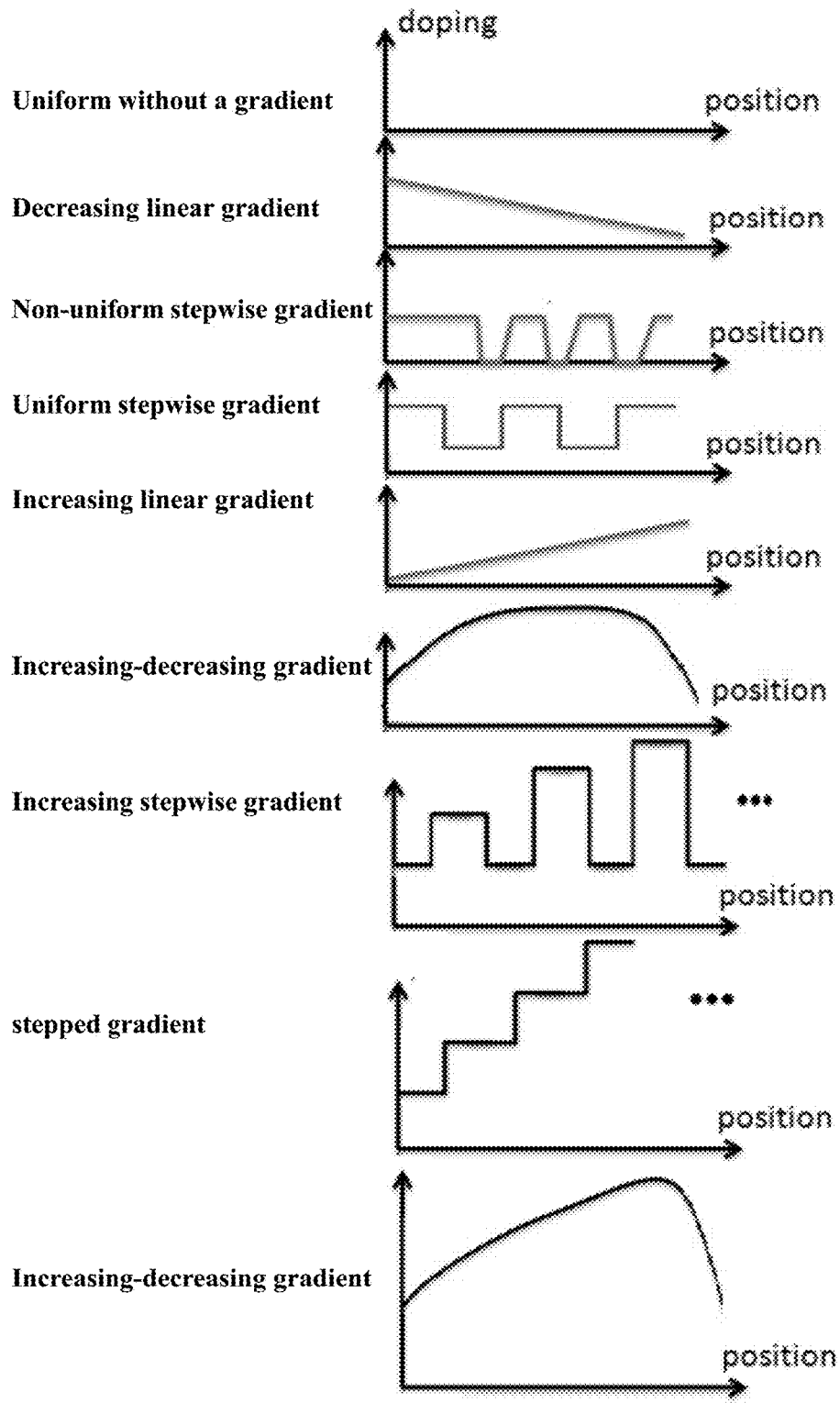
FIG. 4 shows doping profiles of uniform without a gradient; uniform decreasing gradient; uniform stepwise gradient; uniform increasing gradient; increasing-decreasing gradient; and various increasing stepwise gradients.
Figure 5:
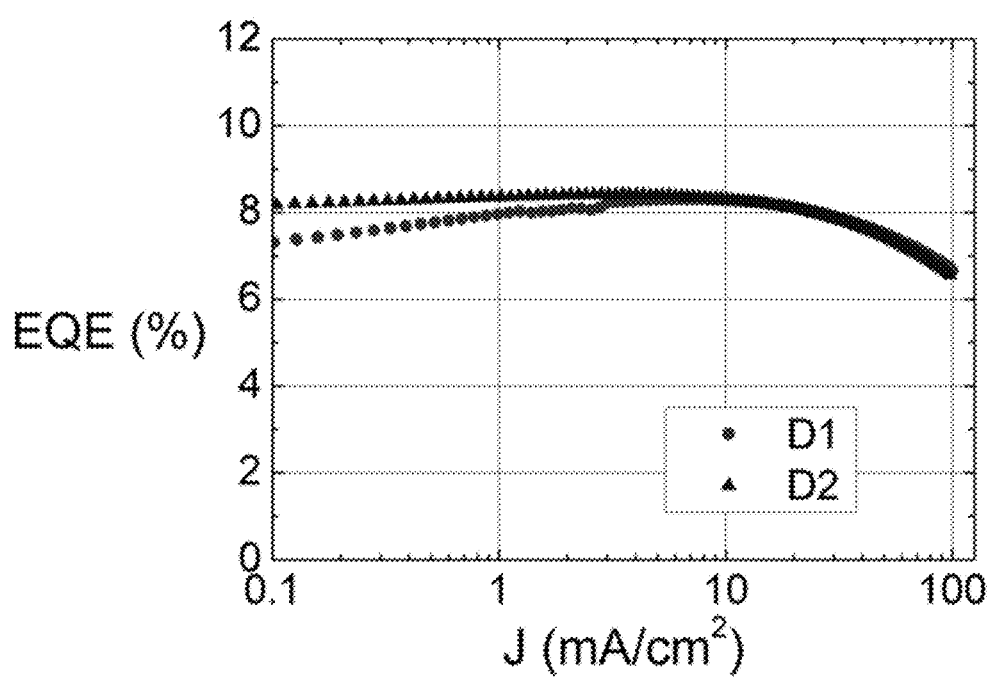
FIG. 5 shows a plot of external quantum efficiency ("EQE") versus current density (mA/cm$^2$) for (i) prior art OLED D1 having device structure ITO/10 nm of Ir(ppy)$_3$/20 nm of NPD/40 nm of blue emissive dopant, Ir(dmp)$_3$, uniformly doped in MCBP at a volume concentration of 15%/5 nm of MCBP/25 nm of Alq$_3$/1 nm of LiF/100 nm Al; (ii) for OLED D2 having device structure ITO/10 nm of Ir(ppy)$_3$/50 nm of blue emissive dopant, Ir(dmp)$_3$, uniformly doped in MCBP at a volume concentration of 15%/5 nm of MCBP/25 nm of Alq$_3$/1 nm of LiF/100 nm Al.
Figure 6:
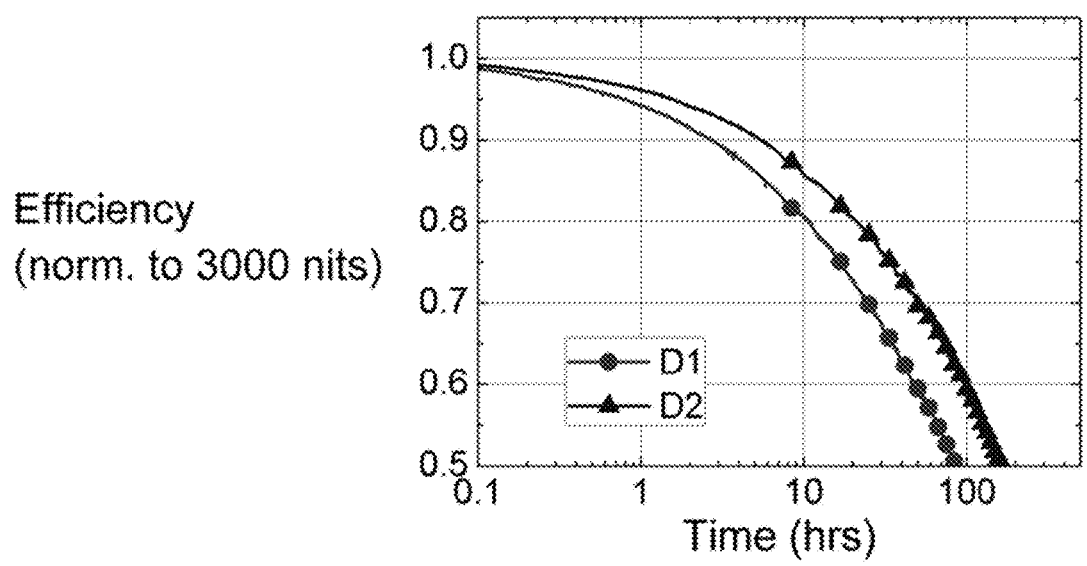
FIG. 6 shows plot of the luminance (normalized to the initial luminance) vs operation time at 70° C. for prior art device D1 and exemplary device D2.
Figure 7:
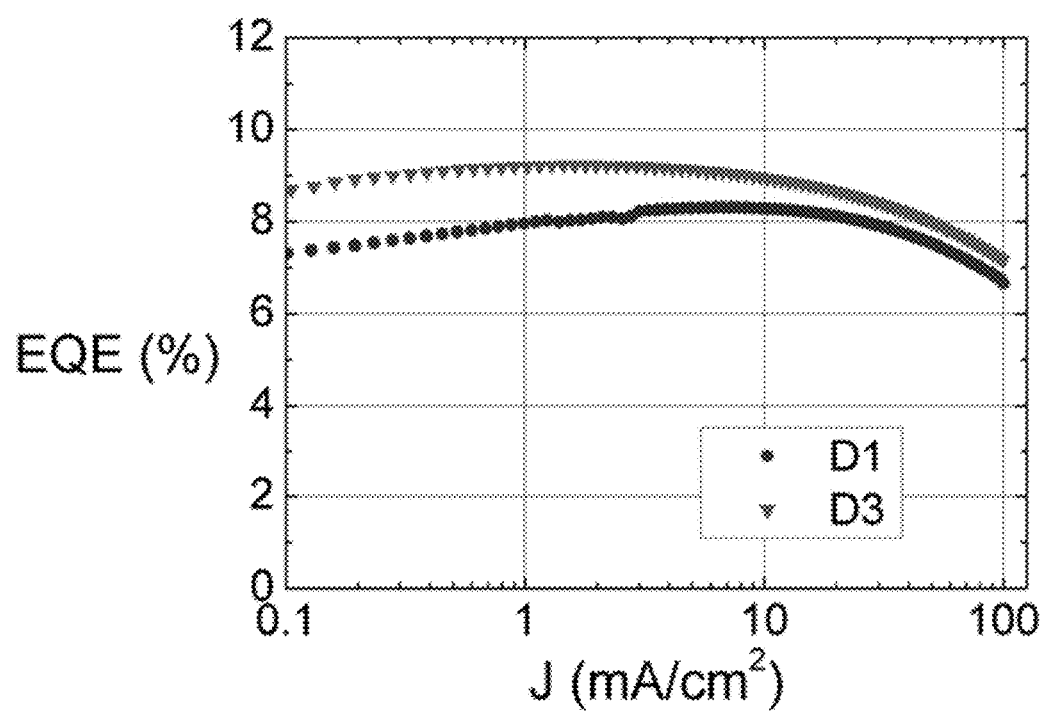
FIG. 7 shows a plot of external quantum efficiency ("EQE") versus current density (mA/cm$^2$) for (i) prior art OLED D1 having device structure ITO/10 nm of Ir(ppy)$_3$/20 nm of NPD/40 nm of blue emissive dopant, Ir(dmp)$_3$, uniformly doped in MCBP at a volume concentration of 15%/5 nm of MCBP/25 nm of Alq$_3$/1 nm of LiF/100 nm Al; (ii) for OLED D3 having device structure ITO/10 nm of Ir(ppy)$_3$/50 nm of blue emissive dopant, Ir(dmp)$_3$, with a concentration gradient that varied linearly with position with 18 vol % (close to the anode) to 8 vol % (close to the cathode) in MCBP/5 nm of MCBP/25 nm of Alq$_3$/1 nm of LiF/100 nm.
Figure 8:
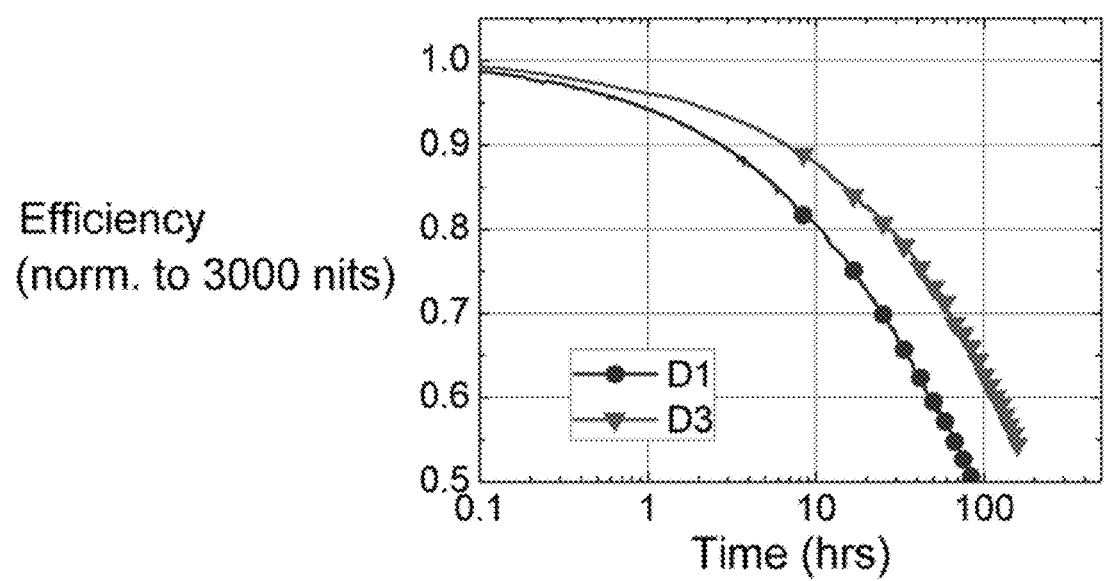
FIG. 8 shows plot of the luminance (normalized to the initial luminance) vs operation time at 70° C. for prior art device D1 and exemplary device D3.
Figure 9:
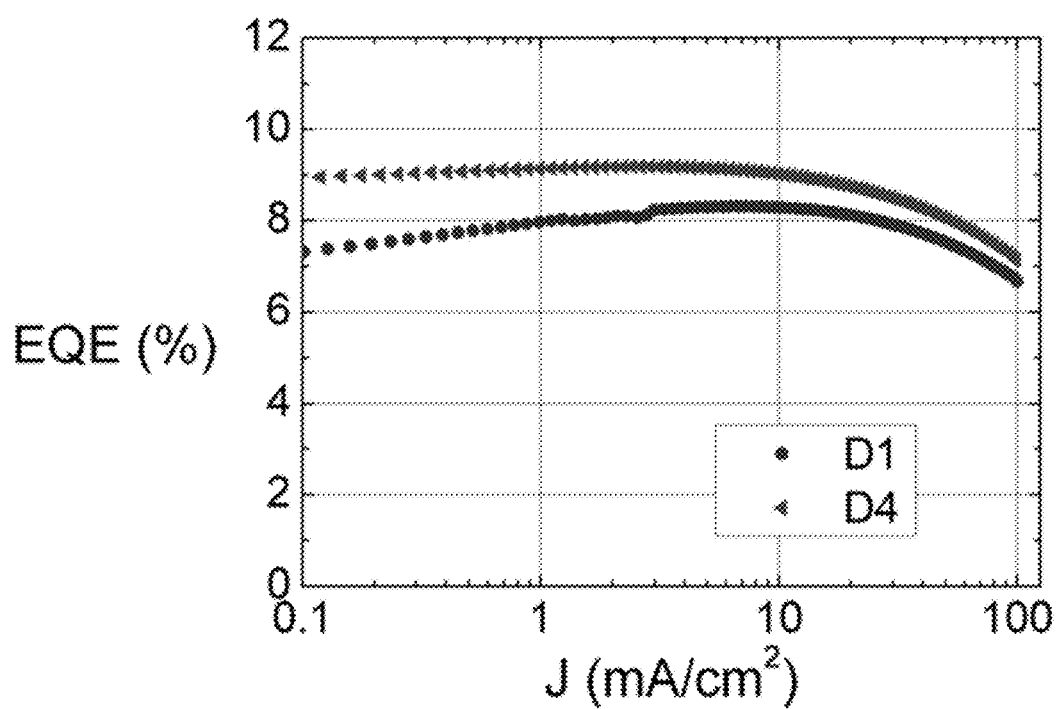
FIG. 9 shows a plot of external quantum efficiency ("EQE") versus current density (mA/cm$^2$) for (i) prior art OLED D1 having device structure ITO/10 nm of Ir(ppy)$_3$/20 nm of NPD/40 nm of blue emissive dopant, Ir(dmp)$_3$, uniformly doped in MCBP at a volume concentration of 15%/5 nm of MCBP/25 nm of Alq$_3$/1 nm of LiF/100 nm Al; (ii) for OLED D4 having device structure ITO/10 nm of Ir(ppy)$_3$ (HIL)/50 nm of blue emissive dopant, Ir(dmp)$_3$ (EML)/5 nm of MCBP/25 nm of Alq$_3$/1 nm of LiF/100 nm, with a concentration gradient of Ir(dmp)$_3$ that varied linearly with position with 23% at the EML/HIL interface, to 7% at the EML/MCBP interface.

FIG. 4 illustrates various concentration gradients which may be used in the first and/or second emissive layers. In one embodiment, the concentration gradient decreases linearly from the cathode side of the emissive layer to the anode side of the emissive layer. In another embodiment, the concentration gradient increases linearly from the cathode side of the emissive layer to the anode side of the emissive layer. In yet other embodiments, the concentration gradient varies in a step wise form. In one embodiment, the concentration gradient comprises a uniform stepwise gradient from the cathode side of the emissive layer to the anode side of the emissive layer. In one embodiment, the concentration gradient comprises a non-uniform stepwise gradient from the cathode side of the emissive layer to the anode side of the emissive layer. In one embodiment, the concentration gradient comprises an increasing-decreasing gradient from the cathode side of the emissive layer to the anode side of the emissive layer. In one embodiment, the concentration gradient comprises an increasing stepped gradient from the cathode side of the emissive layer to the anode side of the emissive layer. In one embodiment, the concentration gradient comprises an increasing stepwise gradient from the cathode side of the emissive layer to the anode side of the emissive layer. These are in contrast to prior art organic light emitting devices where the phosphorescent emissive dopant compound is dispersed uniformly from the cathode side of the emissive layer to the anode side of the emissive layer.

In one embodiment, the concentration gradient of the phosphorescent emissive dopant compound may decrease from the cathode side of the first emissive layer to the anode side of the first emissive layer. The concentration gradient may decrease linearly or non-linearly towards the cathode side of the first emissive layer. When the concentration gradient varies in a non-linear manner, the non-linearity may correspond to a sinusoidal function, a polynomial function including a quadratic function, a cubic function, or a higher order function. In one embodiment, the concentration of the phosphorescent emissive dopant compound decreases from 30 wt. % to 5 wt. % or 30 wt. % to 0 wt. % from the cathode side of the first emissive layer to the anode side of the first emissive layer with the electron transporting compound concentration varying from 70 wt. to 95 wt. % or 70 wt. % to 100 wt. %. At the first emissive layer-electron transport layer interface, the electron transporting compound concentration ranges from 0 wt. % to 15 wt. %.

In another embodiment, the concentration gradient decreases in a step wise form. The phosphorescent emissive dopant compound may be dispersed, in a decreasing manner, in the emissive layer as a plurality of high concentration dopant regions and as a plurality of low concentration dopant regions. In one embodiment, the phosphorescent emissive dopant compound may be dispersed linearly in the high concentration dopant regions or non-linearly in the high concentration dopant regions. In one embodiment, the phosphorescent emissive dopant compound may be dispersed linearly in the low concentration dopant regions or non-linearly in the low concentration dopant regions. When the phosphorescent emissive dopant compound is dispersed a non-linear manner, for either the high concentration dopant region or the low concentration dopant region, the non-linearity may correspond to sinusoidal function, a polynomial function including a quadratic function, a cubic function, or a higher order function. In one embodiment, the phosphorescent emissive dopant concentration in the high concentration dopant region ranges from 5 wt. % to 30 wt. % with the electron transporting compound concentration ranging from 95 wt. % to 70 wt. %. In one embodiment, the phosphorescent emissive dopant concentration in the low concentration dopant region ranges 0 wt. % to 15 wt. % with the electron transporting compound concentration ranging from 100 wt. % to 85 wt. %. In such embodiments, the phosphorescent emissive dopant concentration is constant throughout each the high dopant concentration region and low dopant concentration region. In other such embodiments, the phosphorescent emissive dopant concentration varies linearly or non-linearly in each the high dopant concentration region and low dopant concentration region.

The decreasing step wise concentration gradient may also be achieved by dispersing the phosphorescent emissive dopant compound in the emissive layer as a plurality of first dopant regions and as a plurality of second dopant regions, wherein the first dopant regions are wider than the second dopant regions.

In another embodiment, the concentration gradient of the phosphorescent emissive dopant compound may increase from the cathode side of the emissive layer to the anode side of the emissive layer. The concentration gradient may increase linearly or non-linearly towards the cathode side of the first emissive layer. When the concentration gradient varies in a non-linear manner, the non-linearity may correspond to a sinusoidal function, a polynomial function including a quadratic function, a cubic function, or a higher order function. In one embodiment, the concentration of the phosphorescent emissive dopant compound decreases from 5 wt. % to 30 wt. % or 0 wt. % to 30 wt. % from the cathode side of the first emissive layer to the anode side of the first emissive layer with the electron transporting compound concentration varying from 95 wt. to 70 wt. % or 100 wt. % to 70 wt. %. At the first emissive layer-electron transport layer interface, the electron transporting compound concentration ranges from 15 wt. % to 0 wt. %.

In another embodiment, the concentration gradient increase in a step wise form. The phosphorescent emissive dopant compound may be dispersed, in an increasing manner, in the emissive layer as a plurality of high concentration dopant regions and as a plurality of low concentration dopant regions. The phosphorescent emissive dopant compound may be dispersed linearly in the high concentration dopant regions or non-linearly in the high concentration dopant regions. The phosphorescent emissive dopant compound may be dispersed linearly in the low concentration dopant regions or non-linearly in the low concentration dopant regions. When the phosphorescent emissive dopant compound is dispersed a non-linear manner, for either the high concentration dopant region or the low concentration dopant region, the non-linearity may correspond to a sinusoidal function, a polynomial function including a quadratic function, a cubic function, or a higher order function. In one embodiment, the phosphorescent emissive dopant concentration in the high concentration dopant region ranges from 5 wt. % to 30 wt. % with the electron transporting compound concentration ranging from 95 wt. % to 70 wt. %. In one embodiment, the phosphorescent emissive dopant concentration in the low concentration dopant region ranges 0 wt. % to 15 wt. % with the electron transporting compound concentration ranging from 100 wt. % to 85 wt. %. In such embodiments, the phosphorescent emissive dopant concentration is constant throughout each the high dopant concentration region and low dopant concentration region. In other such embodiments, the phosphorescent emissive dopant concentration varies linearly or non-linearly in each the high dopant concentration region and low dopant concentration region.

The increasing step wise concentration gradient may also be achieved by dispersing the phosphorescent emissive dopant compound in the emissive layer as a plurality of first dopant regions and as a plurality of second dopant regions, wherein the second dopant regions are wider than the first dopant regions.

In embodiments of a stacked organic light emitting device, the first concentration gradient may differ from the second concentration gradient. In another embodiment, the first concentration gradient may be the same as the second concentration gradient.

In one embodiment, the first concentration gradient of the phosphorescent emissive dopant compound may vary from the cathode side of the first emissive layer to the anode side of the first emissive layer. The first concentration gradient may vary linearly or non-linearly towards the cathode side of the first emissive layer. When the first concentration gradient varies in a non-linear manner, the non-linearity may correspond to a sinusoidal function, a polynomial function including a quadratic function, a cubic function, or a higher order function. In such embodiments, the first concentration gradient either decreases from the cathode side of the first emissive layer to the anode side of the emissive layer or increases from the cathode side of the first emissive layer to the anode side of the first emissive layer. In one embodiment, the concentration of the first phosphorescent emissive dopant compound, in the first concentration gradient, varies from 30 wt. % to 5 wt. % or 30 wt. % to 0 wt. % from the cathode side of the first emissive layer to the anode side of the first emissive layer with the electron transporting compound concentration varying from 70 wt. to 95 wt. % or 70 wt. % to 100 wt. %. At the first emissive layer-electron transport layer interface, the electron transporting compound concentration ranges from 0 wt. % to 15 wt. %.

In one embodiment, the second concentration gradient of the second phosphorescent emissive dopant compound may vary from the cathode side of the second emissive layer to the anode side of the second emissive layer. The second concentration gradient may vary linearly or non-linearly towards the cathode side of the first emissive layer. When the second concentration gradient varies in a non-linear manner, the non-linearity may correspond to a sinusoidal function, a polynomial function including a quadratic function, a cubic function, or a higher order function. In such embodiments, the second concentration gradient either decreases from the cathode side of the second emissive layer to the anode side of the second emissive layer or increases from the cathode side of the second emissive layer to the anode side of the second emissive layer. In one embodiment, the concentration of the second phosphorescent emissive dopant compound, in the second concentration gradient, varies from 30 wt. % to 5 wt. % or 30 wt. % to 0 wt. % from the cathode side of the first emissive layer to the anode side of the first emissive layer with the electron transporting compound concentration varying from 70 wt. to 95 wt. % or 70 wt. % to 100 wt. %. At the second emissive layer-interconnecting layer interface, the electron transporting compound concentration ranges from 0 wt. % to 15 wt. %.

In another embodiment, the first concentration gradient may vary in a step wise form. The first phosphorescent emissive dopant compound may be dispersed, in the first emissive layer, as a plurality of high concentration dopant regions and as a plurality of low concentration dopant regions. In one embodiment, the first phosphorescent emissive dopant compound may be dispersed linearly in the high concentration dopant regions or non-linearly in the high concentration dopant regions. In one embodiment, the first phosphorescent emissive dopant compound may be dispersed linearly in the low concentration dopant regions or non-linearly in the low concentration dopant regions. When the first phosphorescent emissive dopant compound is dispersed a non-linear manner, for either the high concentration dopant region or the low concentration dopant region, the non-linearity may correspond to a sinusoidal function, a polynomial function including a quadratic function, a cubic function, or a higher order function.

In one embodiment, the phosphorescent emissive dopant concentration in the high concentration dopant region, of the first concentration gradient, ranges from 5 wt. % to 30 wt. % with the electron transporting compound concentration ranging from 95 wt. % to 70 wt. %. In one embodiment, the phosphorescent emissive dopant concentration in the low concentration dopant region, of the first concentration gradient, ranges 0 wt. % to 15 wt. % with the electron transporting compound concentration ranging from 100 wt. % to 85 wt. %. In such embodiments, the phosphorescent emissive dopant concentration is constant throughout each the high dopant concentration region and low dopant concentration region. In other such embodiments, the phosphorescent emissive dopant concentration varies linearly or non-linearly in each the high dopant concentration region and low dopant concentration region.

In another embodiment, the second concentration gradient may vary in a step wise form. The second phosphorescent emissive dopant compound may be dispersed, in the second emissive layer, as a plurality of high concentration dopant regions and as a plurality of low concentration dopant regions. In one embodiment, the second phosphorescent emissive dopant compound may be dispersed linearly in the high concentration dopant regions or non-linearly in the high concentration dopant regions. In one embodiment, the second phosphorescent emissive dopant compound may be dispersed linearly in the low concentration dopant regions or non-linearly in the low concentration dopant regions. When the first phosphorescent emissive dopant compound is dispersed a non-linear manner, for either the high concentration dopant region or the low concentration dopant region, the non-linearity may correspond to a sinusoidal function, a polynomial function including a quadratic function, a cubic function, or a higher order function.

In one embodiment, the phosphorescent emissive dopant concentration in the high concentration dopant region, of the second concentration gradient, ranges from 5 wt. % to 30 wt. % with the electron transporting compound concentration ranging from 95 wt. % to 70 wt. %. In one embodiment, the phosphorescent emissive dopant concentration in the low concentration dopant region, of the second concentration gradient, ranges 0 wt. % to 15 wt. % with the electron transporting compound concentration ranging from 100 wt. % to 85 wt. %. In such embodiments, the phosphorescent emissive dopant concentration is constant throughout each the high dopant concentration region and low dopant concentration region. In other such embodiments, the phosphorescent emissive dopant concentration varies linearly or non-linearly in each the high dopant concentration region and low dopant concentration region.

The varying step wise first concentration gradient or second concentration gradient may also be achieved by dispersing the phosphorescent emissive dopant compound in the emissive layer as a plurality of first dopant regions and as a plurality of second dopant regions where the second dopant regions are located on the cathode side of the first or second emissive layer. In one embodiment, the first dopant regions are wider than the second dopant regions. In one embodiment, the second dopant regions are wider than the first dopant regions.

The first emissive layer and/or the second emissive layer may include one or more phosphorescent emissive dopant compound capable of, alone or in combination, emitting a desired spectrum of light. Examples of phosphorescent emissive materials include $Ir(ppy)_3$. Many useful emissive materials include one or more ligands bound to a metal center. A ligand may be referred to as "photoactive" if it contributes directly to the luminescent properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels directly involved in light emission.

A ligand that is photoactive in one molecule may be ancillary in another. These definitions of photoactive and ancillary are intended as non-limiting theories. Representative phosphorescent emissive dopant compounds may be found in U.S. Pat. Nos. 7,534,505, 7,393,599; 7,445,855, 7,338,722 and 7,655,323 each of which is incorporated in its entirety herein. In some embodiments, the phosphorescent compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

In one embodiment, the phosphorescent emissive dopant compound has a peak emission wavelength less than 500 nm, preferably less than 450 nm. Representative examples of such phosphorescent emissive dopant compounds may be found in U.S. Pat. Nos. 6,458,475, 7,294,849 and 8,142,909 each of which is incorporated in its entirety herein.

The emissive layer may further include an electron transport compound as host material. The electron transport compound is selected so the phosphorescent emissive dopant compound has a HOMO energy level at least 0.5 eV lower than a HOMO level of the electron transporting compound. In one embodiment, the electron transport is performed primarily by the electron transporting compound. In such embodiments, the concentration of the phosphorescent emissive dopant compound ranges from 0 wt. % to 30 wt. % or 5 wt. % to 30 wt. % and the concentration of the electron transporting compound ranges from 100 wt. % to 70 wt. % or 95 wt. % to 70 wt. %

In one embodiment, the emissive layer may further include a second electron transport compound as a co-host material. The second electron transport compound is selected so the phosphorescent emissive dopant compound has a HOMO energy level at least 0.5 eV lower than a HOMO level of the second electron transporting compound. In such embodiments, the electron transporting compound and second electron transporting compound have similar triplet energies, HOMO and LUMO but different chemical compositions. In such embodiments, the concentration of the phosphorescent emissive dopant compound ranges from 0 wt. % to 30 wt. % or 5 wt. % to 30 wt. % and the combined concentration of the first and second electron transporting compounds ranges from 100 wt. % to 70 wt. % or 95 wt. % to 70 wt. %.

The electron transport layer may include a material capable of transporting electrons. Electron transport layer may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. Patent Application Publ. No. 20030230980, to Forrest et al., which is incorporated by reference in its entirety. Other electron transport layers may be used.

In the embodiment of a stacked organic light emitting device, as illustrated in FIG. 3, the device may include an interconnecting layer may consist of a hole blocking layer, a metal (for example, lithium or cesium) doped electron transport layer, a very thin (<3 nm) metal (for example, silver or lithium), and a thin hole injection layer. Here, the hole injection layer could be either organic or metal oxides.

Exemplary materials for hole blocking layers, electron transport layers and hole injection layers may be found in U.S. Pat. No. 7,683,536 which is incorporated by reference in its entirety herein.

Cathode 260 may be any suitable material or combination of materials known to the art, such that cathode 260 is capable of conducting electrons and injecting them into the organic layers of device 200. Cathode 260 may be transparent or opaque, and may be reflective. Metals and metal oxides are examples of suitable cathode materials. Cathode 260 may be a single layer, or may have a compound structure. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer.

Experimental

For devices described below, the blue dopant/host combination of fac-tris[3-(2,6-dimethylphenyl)-7-methylimidazo[1,2-f]phenanthridine]iridium (III) ("Ir(dmp)$_3$") and 4,4'-bis(3-methylcarbazol-9-yl)-2,2'-biphenyl (MCBP), respectively, were used (previously reported Giebink, N. C., D'Andrade, B. W., Weaver, M. S., Mackenzie, P. B., Brown, J. J., Thompson, M. E. & Forrest, S. R. Intrinsic luminance loss in phosphorescent small-molecule organic light emitting devices due to bimolecular annihilation reactions, *J. Appl. Phys.* 103 (2008)).

The comparative device, D1, consists of 120 nm of ITO as the anode, 10 nm of tris(2-phenylpyridine) iridium ("Ir(ppy)$_3$") as the hole injection layer ("HIL"), 20 nm of 4,4'-bis[N-(1-naphthyl)-N-phenyl-amino]-biphenyl (NPD) as the hole transport layer ("HTL"), 40 nm of blue emissive dopant, Ir(dmp)$_3$, uniformly doped in MCBP at a volume concentration of 15% as the emissive layer ("EML"), 5 nm of MCBP as the hole blocking layer ("HBL"), (which could be viewed as part of the ETL), 25 nm of tris(8-hydroxyquinoline)aluminum ("Alq$_3$") as the electron transport layer ("ETL"), and 1 nm of LiF with 100 nm of aluminum as the cathode.

Inventive device D2 consists of 120 nm of ITO as the anode, 10 nm of Ir(ppy)$_3$ as the HIL, 50 nm of blue emissive dopant, Ir(dmp)$_3$ uniformly doped in MCBP at a volume concentration of 15 vol. % as the EML, 5 nm of MCBP as the HBL, 25 nm of Alq$_3$ as the ETL, and 1 nm of LiF with 100 nm of aluminum as the cathode.

Inventive devices D3, D4 and D5 consist of 120 nm of ITO as the anode, 10 nm of Ir(ppy)$_3$ as the HIL, 50 nm of blue emissive dopant, Ir(dmp)$_3$ uniformly doped in MCBP at a volume concentration of 15% as the EML, 5 nm of MCBP as the HBL, 25 nm of Alq$_3$ as the ETL, and 1 nm of LiF with 100 nm of aluminum as the cathode. In the EML of D3, the Ir(dmp)$_3$ is doped in mCBP with a concentration gradient that varied linearly with position with 18 vol % (close to the anode) to 8 vol % (close to the cathode). In the EML of D4, the Ir(dmp)$_3$ is doped in mCBP with a concentration gradient that varied linearly with position with 23% at the EML/HIL interface, to 7% at the EML/HBL interface. In the EML of D5, the Ir(dmp)$_3$ is doped in mCBP with a concentration gradient that varied linearly with position from 20% at the EML/HIL interface, to 10% at the EML/HBL interface.

Inventive device D6 consists of 120 nm of ITO as the anode, 10 nm of Ir(ppy)$_3$ as the HIL, 60 nm of blue emissive dopant, Ir(dmp)$_3$ uniformly doped in MCBP at a volume concentration of 15% as the EML, 5 nm of MCBP as the HBL, 25 nm of Alq$_3$ as the ETL, and 1 nm of LiF with 100 nm of aluminum as the cathode. In the EML of D6, the Ir(dmp)$_3$ is doped in mCBP with a concentration gradient so that starting from the EML/HIL interface, the Ir(dmp)$_3$ concentration is uniform at 15 vol. % for the first 30 nm, and then three bi-layers (a total of 30 nm) of 5 nm of 3 vol. % Ir(dmp)$_3$ concentration and 5 nm of 15 vol. % Ir(dmp)$_3$ concentration.

Inventive device D7 consists of 120 nm of ITO as the anode, 10 nm of Ir(ppy)$_3$ as the HIL, 60 nm of blue emissive dopant, Ir(dmp)$_3$ uniformly doped in MCBP at a volume concentration of 15% as the EML, 5 nm of MCBP as the HBL, 25 nm of Alq$_3$ as the ETL, and 1 nm of LiF with 100 nm of aluminum as the cathode. In the EML of D7, the Ir(dmp)$_3$ is doped in mCBP with a concentration gradient so starting from the EML/HIL interface, the Ir(dmp)$_3$ concentration is uniform at 15% for the first 30 nm, and then 3 pairs of the following bi-layers with gradually changing Ir(dmp)$_3$ concentrations: 5 nm of Ir(dmp)$_3$ layer with Ir(dmp)$_3$ concentration gradually changed from 15% to 3%, 5 nm of Ir(dmp)$_3$ layer with Ir(dmp)$_3$ concentration gradually changed from 3% to 15%.

A second comparative device D8 had the following structure: 120 nm ITO anode/10 nm hexaazatriphenylene hexacarbonitrile (HATCN) HIL/20 nm NPD/40 nm Ir(dmp)$_3$ in MCBP/5 nm mCBP HBL/30 nm of Alq$_3$ as ETL/1.5 nm 8-hydroxyquinolinato lithium (Liq)/100 nm Al cathode.

Inventive device D9 has the following structure: 120 nm ITO anode/10 nm hexaazatriphenylene hexacarbonitrile (HATCN) HIL/50 nm EML Ir(dmp)$_3$ in MCPB/5 nm MCBP HBL/30 nm Alq$_3$ as ETL/1.5 nm 8-hydroxyquinolinato lithium (Liq)/100 nm Al cathode.

Inventive device D10 has the following structure: 120 nm ITO anode/10 nm hexaazatriphenylene hexacarbonitrile (HATCN) HIL/50 nm EML Ir(dmp)$_3$ where Ir(dmp)$_3$ varied from 18% to 8%/5 nm MCBP HBL/30 nm Alq$_3$ as ETL/1.5 nm 8-hydroxyquinolinato lithium (Liq)/100 nm Al cathode.

An inventive device D11 is a two-unit stacked OLED (SOLED). The structure of D11 is 120 nm ITO/10 nm HATCN/50 nm EML/5 nm mCBP/5 nm Alq$_3$/70 nm 2 vol % Li doped Alq$_3$/10 nm HATCN/50 nm EML/5 nm mCBP/25 nm Alq$_3$/1.5 nm Liq/100 nm Al.

Thin films were deposited by thermal evaporation on pre-cleaned ITO-on-glass substrates in a system with a background pressure of ~5×10$^{-7}$ Torr. The devices were grown on pre-patterned ITO with an active area of 2 mm$^2$ defined by openings in a polyimide layer that define the pixels and packaged in an ultrahigh purity N$_2$-filled glove box with <0.5 ppm oxygen and water concentration without exposure to air following film deposition. Devices for exciton sensing the EML were grown on 70 nm of ITO with an active area of 0.785 mm$^2$ defined by shadow masks during cathode deposition.

Current density-voltage-luminance (J-V-L) characteristics were measured using a parameter analyzer (HP4145, Hewlett-Packard) and a calibrated photodiode (FDS1010-CAL from Thorlabs) following standard procedures as reported by Forrest, S. R., Bradley, D. D. C. & Thompson, M. E. Measuring the efficiency of organic light-emitting devices. *Adv. Mater.* 15, 1043-1048 (2003). Emission spectra were measured with a calibrated fiber-coupled spectrometer (USB4000, Ocean Optics) at J=10 mA/cm$^2$. Lifetime tests were carried out with PHOLEDs driven by constant current sources (U2722, Agilent), and the voltage and luminance is recorded by a data logger (Agilent 34972A).

Ultraviolet photoelectron spectra (UPS) of organic films were measured in an ultrahigh vacuum (UHV) analysis chamber using the illumination from the He Iα line with 21.2 eV of energy.

To evaluate the electron and hole transport characteristics in the EMLs, hole-only (hO) devices with the structure: ITO/10 nm NPD/60 nm EML/10 nm NPD/100 nm Al, and electron-only (eO) devices with the structure: ITO/10 nm Alq$_3$/60 nm EML/10 nm Alq$_3$/1.5 nm Liq/100 nm Al were fabricated. The EMLs for these devices consisted of Ir(dmp)$_3$ doped mCBP at volume concentrations of 0% (hO0 and eO0), 8% (hO1 and eO1), 13% (hO2 and eO2), and 18% (hO3, hO3). Prior to the organic film depositions, the ITO-coated-glass substrates for hO0-hO3 were treated with UV-ozone for 10 min, whereas eO0-eO3 were not pretreated.

To determine the hole blocking efficiency and thus the shape of the exciton formation zones in D8-D10, we fabricated a series of structures with a thin red emitting "sensing" layer using the dopant, iridium (III) bis(2-phenyl quinolyl-N,C$^{2'}$) acetylacetonate (PQIr) whose relative emission intensity can provide information about the spatial distribution of excitons in the EML. Here, PQIr is co-doped at 2 vol % at different positions separated by 5 nm in the EMLs of D1-D3, with a doping layer width of 1.5 nm. Since the HOMO and LUMO energies of PQIr are at 5.0 eV and 2.7 eV relative to the vacuum level, respectively, this dopant is not expected to trap holes in the EML (Kann, H., Holmes, R. J., Sun, Y., Kena Cohen, S. & Forrest, S. R. White Stacked Electrophosphorescent Organic Light Emitting Devices Employing MoO3 as a Charge Generation Layer. *Advanced Materials* 18, 339-342 (2006)). Also, due to the low doping concentration and narrowness of the sensing layers, it should not significantly affect the charge transport or recombination properties in the EML. This is confirmed by the almost identical J-V characteristics between devices with and without sensing layers.

Devices were also prepared where the emissive layer contains a phosphorescent emissive dopant compound and two co-hosts. The devices are as follows:

D12: Irppy100/NPD200/mCBP:Blue15% 400/mCBP50/Alq250; D13: Irppy100/mCBP:Blue15% 600/mCBP50/Alq250; D14: Irppy100/mCBP(55%):TcTa(30%):Blue (15%) 600/mCBP(65%):TcTa(35%) 50/Alq250; D15: Irppy100/mCBP(55%):TcTa(30%):Blue(15%) 600/mCBP50/Alq250; D16: Irppy100/mCBP(1.1 A/s):TcTa(0.6 A/s):Blue(0.5 A/s-0.15 A/s) 600/mCBP50/Alq250; and D17: Irppy100/mCBP(1.7 A/s):Blue(0.5 A/s-0.15 A/s) 600/mCBP50/Alq250

FIGS. 27-30 illustrate (a) a plot of current density (mA/cm$^2$) versus voltage (V); (b) a plot of external quantum efficiency versus current density (mA/cm$^2$); (c) a plot of change in voltage with time; and (d) a plot of efficiency versus time for devices D12-D15, respectively.

FIGS. 31-34 illustrate (a) a plot of current density (mA/cm$^2$) versus voltage (V); (b) a plot of external quantum efficiency versus current density (mA/cm$^2$); (c) a plot of change in voltage with time; and (d) a plot of efficiency versus time for devices D13, D15, D16 and D17, respectively.

Results and Discussion

FIGS. 5, 7, 9, 11, 13 and 15 illustrate the improvements in external quantum efficiency (EQE) from D1 to D2, D3, D4, D5, D6 and D7, respectively.

FIGS. 6, 8, 10, 12, 14 and 16 illustrate the improvements in operational lifetime (i.e. efficiency decay as a function of time under the constant current operation mode) from D1 to D2, D3, D4, D5, D6 and D7, respectively. Note here all devices are measured with an initial brightness of 3000 cd/m2. Therefore, the operating current for these measurements are 22.5, 22.8, 21.0, 21.0, 21.1, 20.4, 21.6 mA/cm2 for D1-D7 respectively.

If the device operational lifetime is defined as the time it takes for the device efficiency to decay to 80% of the initial efficiency (T80), the lifetime for D1-D7 is then 10.7, 20.9, 27.4, 31.6, 37.9, 33.2, and 30.7 hours respectively. If assuming a degradation acceleration factor of 1.5, the device lifetime at 1000 cd/m2 can be approximately 5.2 times longer than at 3000 cd/m2.

For the two-unit stacked OLED (SOLED), since two EMLs are utilized, it is expected that the brightness of each EML only needs to be half of the improved brightness of devices D2-D7 (i.e. the EQE of the SOLED is expected to be doubled from the D2-D7). Therefore, assuming an degradation acceleration factor of 1.5, its operational lifetime should be improved by 2.8 times from the previous improvements. Combining this approach and the best lifetime improvements from the gradually changing doping profile, the total lifetime improvement is expected to be approximately 10 times from the control device.

The reason for the improved EQEs and lifetimes in D2 from D1 is attributed to effective harvesting of triplet excitons through emission, rather than non-radiative recombination. NPD has a triplet level of 2.3 eV, lower than the triplet energy of the blue emissive dopant, and thus the EML/HTL interface cannot effectively confine the triplet excitons, leading to EQE loss. Also, non-radiative triplet decay in NPD could lead to energy dissipation in the HTL, causing degradation. NPD was also previous found unstable even for hole transporting alone.

The reason for the improved EQEs and lifetimes in D3-D7 from D2 is attributed to extended recombination regions. In the EML, the frontier orbital levels for electron and hole transports are such that the guest molecules are hole transporters and electron blockers, and the host molecules are electron transporters and hole blockers. For D3-D5, by grading the guest concentration, rather than facing an abrupt blocking interface in D2, the holes are gradually blocked towards the cathode, and the electrons are also gradually blocked towards the anode. For D6-7, by introducing repeating high/low doping profiles in the EML, multiple exciton blocking interfaces exist in the EML, in comparison to single blocking interface at the EML/HBL interface in D2.

Figure 17:
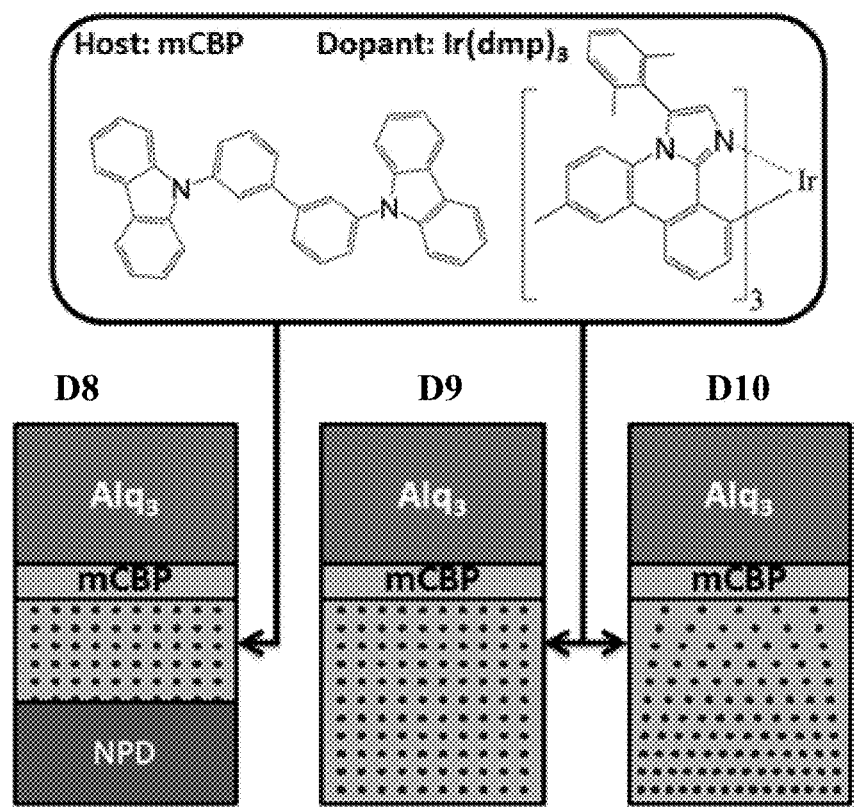
FIG. 17 illustrates the concentration of the blue emissive dopant, Ir(dmp)$_3$, in the emissive layer of devices D1, D2 and D3.
Figure 18A:
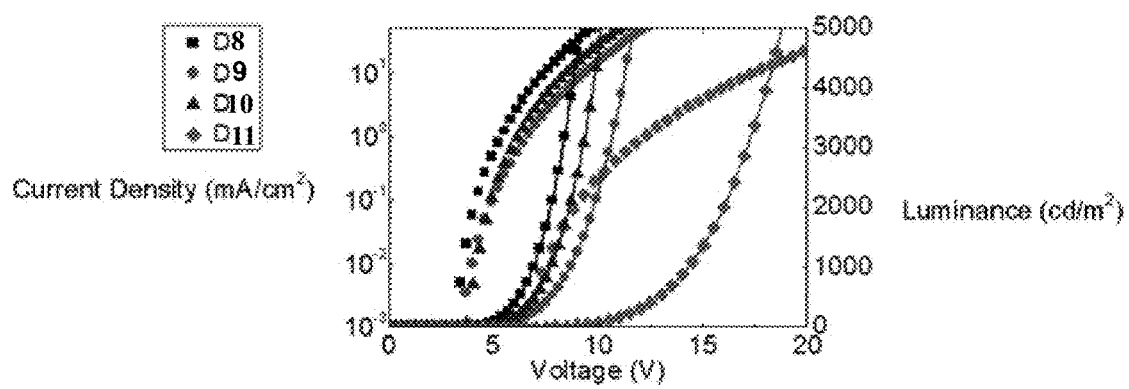
FIG. 18a illustrates the current density-voltage (J-V, scattered markers) and luminance-voltage (L-V, line-connected markers) characteristics for devices D8-D11, where D11 is a stack of two blue emitting PHOLED whose EMLs are identical to D10.
Figure 18B:
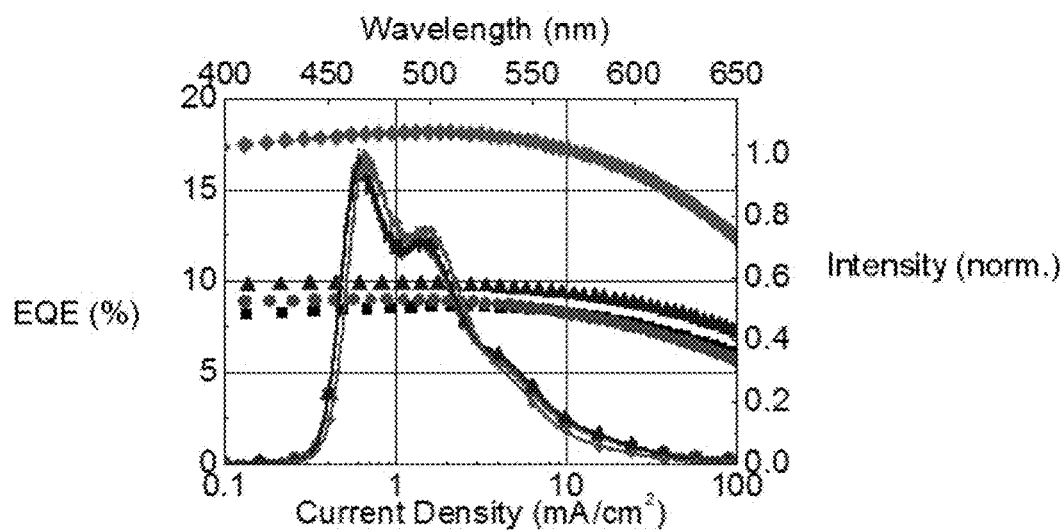
FIG. 18b illustrates the external quantum efficiency (EQE) v.s. J (left axis) and emission spectra (right axis) for D8-D11. D8 has a device structure of ITO/10 nm HATCN/20 nm NPD/40 nm Ir(dmp)$_3$ in MCBP/5 nm MCBP/30 nm of Alq$_3$/1.5 nm Liq/100 nm Al. D9 has the following structure: ITO/10 nm HATCN/50 nm Ir(dmp)$_3$ in MCBP/5 nm MCBP/30 nm Alq$_3$/1.5 nm Liq/Al. Device D10 has the following structure of ITO/10 nm HATCN/50 nm Ir(dmp)$_3$ in MCPB where Ir(dmp)$_3$ varied from 18% to 8%/5 nm MCBP/30 nm Alq$_3$/1.5 nm Liq/Al.

FIGS. 18a and 18b illustrate the current density-voltage-luminance (J-V-L), external quantum efficiency (EQE), and emission spectral characteristics of devices D8-D11, illustrated in FIG. 17, and are summarized in Table 1. Replacing the HTL in D8 with an EML in D9 results in an increase in the operating voltage, as expected. Also, use of a graded doping profile in the EML (D10) decreases the operational voltage compared to the uniformly D9. Further, the emission spectra of all four devices are comparable, with the EQE of D8 and D9 being almost identical above 1 mA/cm². The EQE of D10 is more than 10% higher than those of D8 and D9. As expected for a stacked OLED, D11 has approximately double the voltage and EQE compared with D3 (Forrest, S., Burrows, P., Shen, Z., Gu, G., Bulovic, V. & Thompson, M., The stacked OLED (SOLED): a new type of organic device for achieving high-resolution full-color displays, *Synthetic Metals* 91, 9-13 (1997)); for example, at 10 mA/cm², D11 operates at a voltage of 17.4 V and EQE=17.2% compared to 8.5 V and 9.3% for D10. This indicates a slight but measurable loss in the stacked device due to inefficiencies in charge generation in the layers between the stacked elements, and in optical field distribution within the stack as reported by Cho, T.-Y., Lin, C.-L. & Wu, C.-C. Microcavity two-unit tandem organic light-emitting devices having a high efficiency. *Appl. Phys. Lett.* 88, 111106-111106-111103 (2006).

Figure 19:
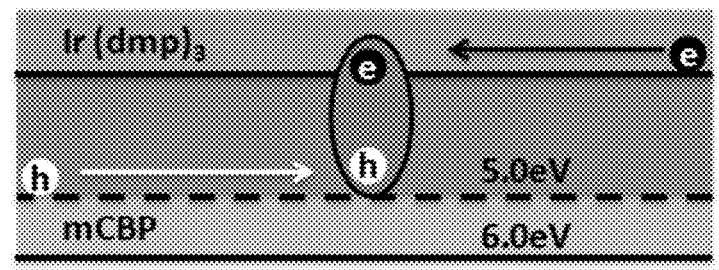
FIG. 19 illustrates electron and hole transport and recombination energetics in exemplary emissive layer where Ir(dmp)$_3$ is a hole transporting blue emissive compound and mCPB is an electron transporting compound.
Figure 22:
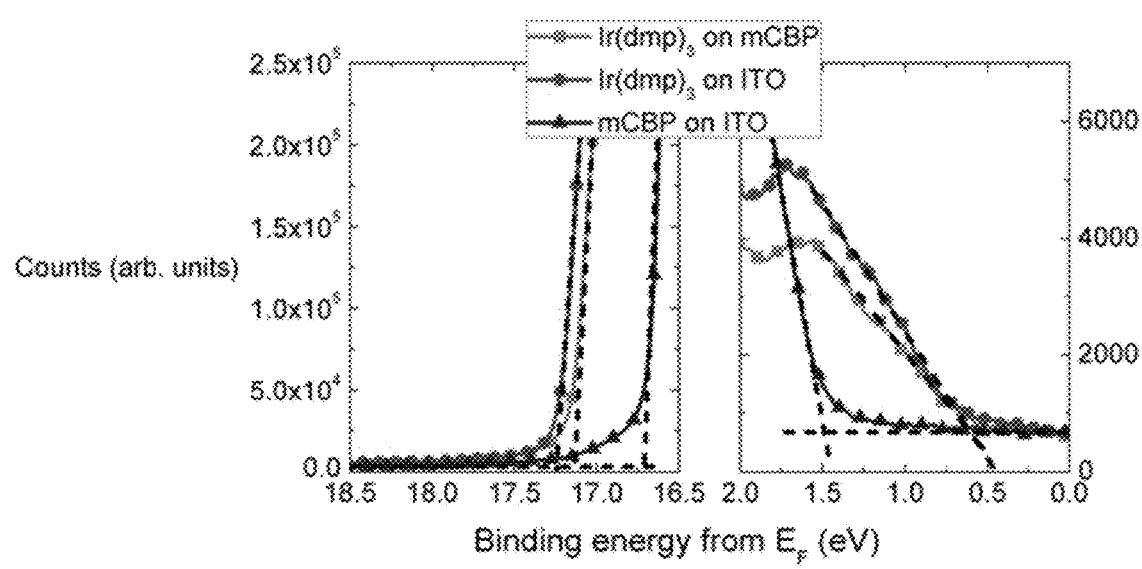
FIG. 22 illustrates ultraviolet photoelectron spectroscopy (UPS) data from Ir(dmp)₃ on MCPP, Ir(dmp)₃ on ITO and MCPB on ITO.

To understand the charge transport characteristics in the various EMLs, we measured the ultraviolet photoelectron spectra (UPS) of thin films of mCBP, Ir(dmp)$_3$, as well as Ir(dmp)$_3$ deposited on mCBP. FIG. 22 shows the UPS from 50 nm thick layers of mCBP and Ir(dmp)3 on ITO, and 50 nm-Ir(dmp)$_3$-on-50 nm-mCBP on ITO. The highest occupied molecular orbital energies (HOMOs) of mCBP and Ir(dmp)$_3$ are 6.0±0.1 eV and 4.6±0.1 eV respectively. After considering the dipole energy shift, of ~0.4 eV, when Ir(dmp)$_3$ is deposited on mCBP, mCBP and Ir(dmp)$_3$ have HOMO energies of 6.0 eV and 5.0 eV, respectively, as shown in FIG. 19. Thus, it is expected that at sufficiently high concentrations, the dopant supports hole transport in the EML.

Figure 23A:
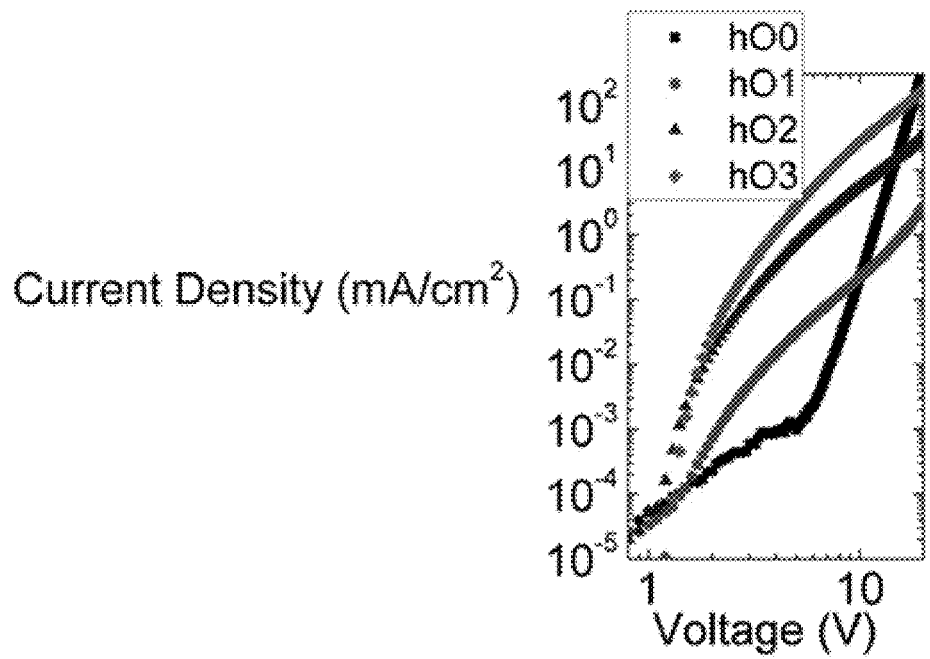
FIG. 23a illustrates current density-voltage (J-V) characteristics of hole-only device and FIG. 23b illustrates current density-voltage (J-V) characteristics of electron-only devices.
Figure 23B:
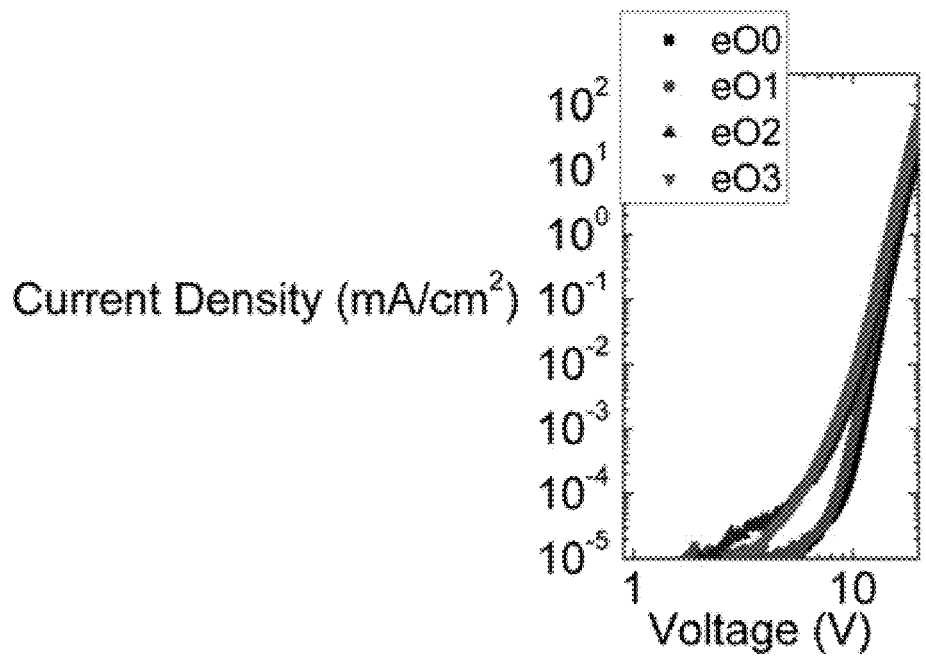

The current density-voltage (J-V) characteristics for hole- and electron-only devices is shown in FIGS. 23a and 23b. The conduction mechanism illustrated is confirmed by the J-V characteristics of hole-only devices that show improved hole transport when increasing the Ir(dmp)$_3$ concentration in mCBP. The Js of hO devices increase with the increasing doping concentration of Ir(dmp)$_3$. This is consistent with the UPS result that hole transport in the EMLs is through Ir(dmp)$_3$. Also, the conduction characteristics of electron-only devices indicate electron transport in the EML occurs solely through mCBP. As illustrated in FIG. 23b, Js of eO devices stays approximately the same at different Ir(dmp)$_3$ concentrations, suggesting that electron transport in the EMLs is through mCBP.

In this architecture, recombination occurs between an electron in the lowest unoccupied molecular orbit (LUMO) of mCBP and a hole in the Ir(dmp)$_3$ HOMO, resulting in an exciplex. Since the PHOLED emission is solely from the phosphorescence of Ir(dmp)$_3$, the intermediate exciplex state rapidly transfers its energy to the Ir(dmp)$_3$ triplet. Note that the thermalization loss when an electron on mCBP recombines with a hole in Ir(dmp)$_3$ is 1.0 eV less than for a hole in the mCBP HOMO, contributing to the relatively high operational stability in the blue PHOLEDs observed and in D8. (previously as reported by Giebink et al.)

Figure 20:
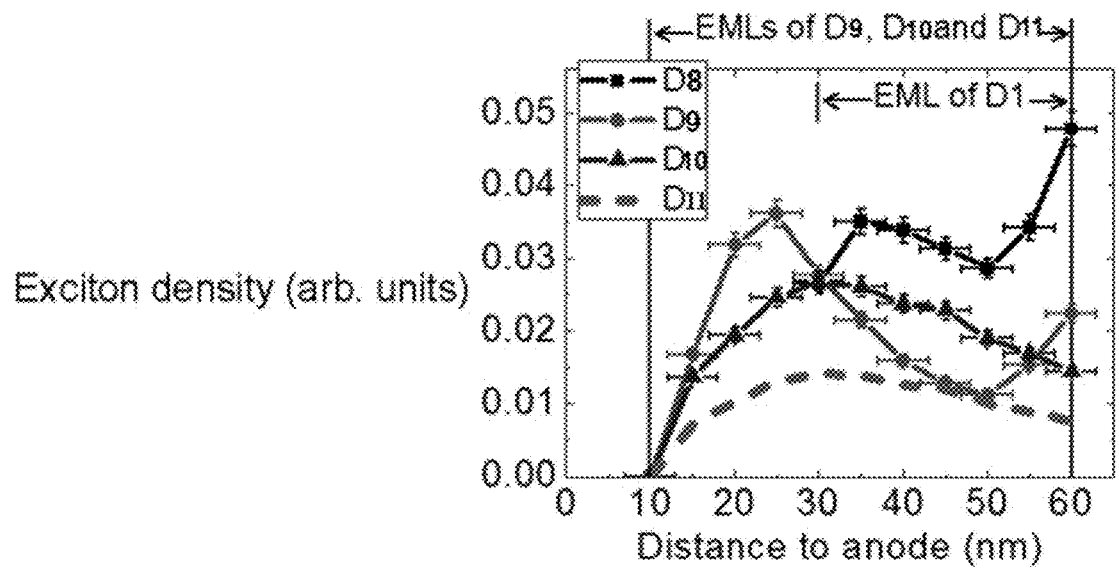
FIG. 20 illustrates exciton density profile in the EMLs of D8-D10 calculated from "probe" devices employing iridium (III) bis(2-phenyl quinolyl-N,C$^{2'}$) acetylacetonate (PQIr) in the red light emitting sensing layer. The profiles are normalized to integrated exciton densities in the EMLs of unity. Also, the exciton density profile of D4 is calculated from the D3 profile.

The hole conductivity in the graded EML of D10 increases as the distance to the hole injection layer (HIL)/EML interface is decreased due to the increasing concentration of Ir(dmp)$_3$. In the opposite direction toward the EML/hole blocking layer (HBL) interface, the hole conductivity decreases while the electron conductivity stays approximately constant. Thus, in contrast to the abrupt hole blocking by the EML/HBL interface in D8 and D9, FIG. 20, holes are gradually blocked by the hole conductivity gradient in the EML in D10. As a consequence, exciton formation in D10 occurs over a more extended distance as compared to either D8 or D9 as illustrated in FIG. 20.

Figure 10:
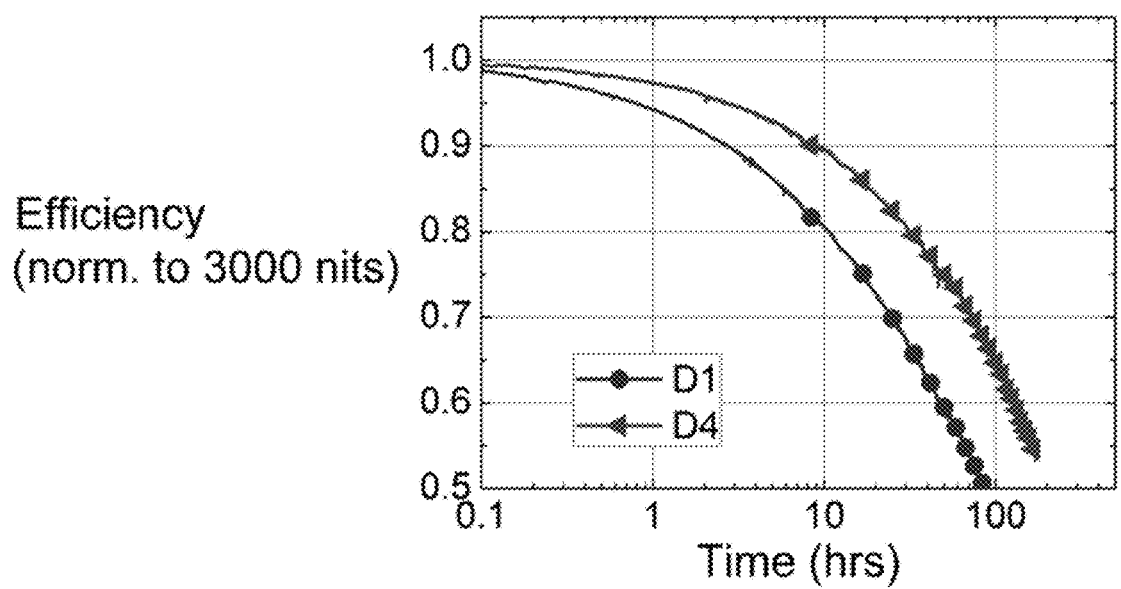
FIG. 10 shows plot of the luminance (normalized to the initial luminance) vs operation time at 70° C. for prior art device D1 and exemplary device D4.
Figure 11:
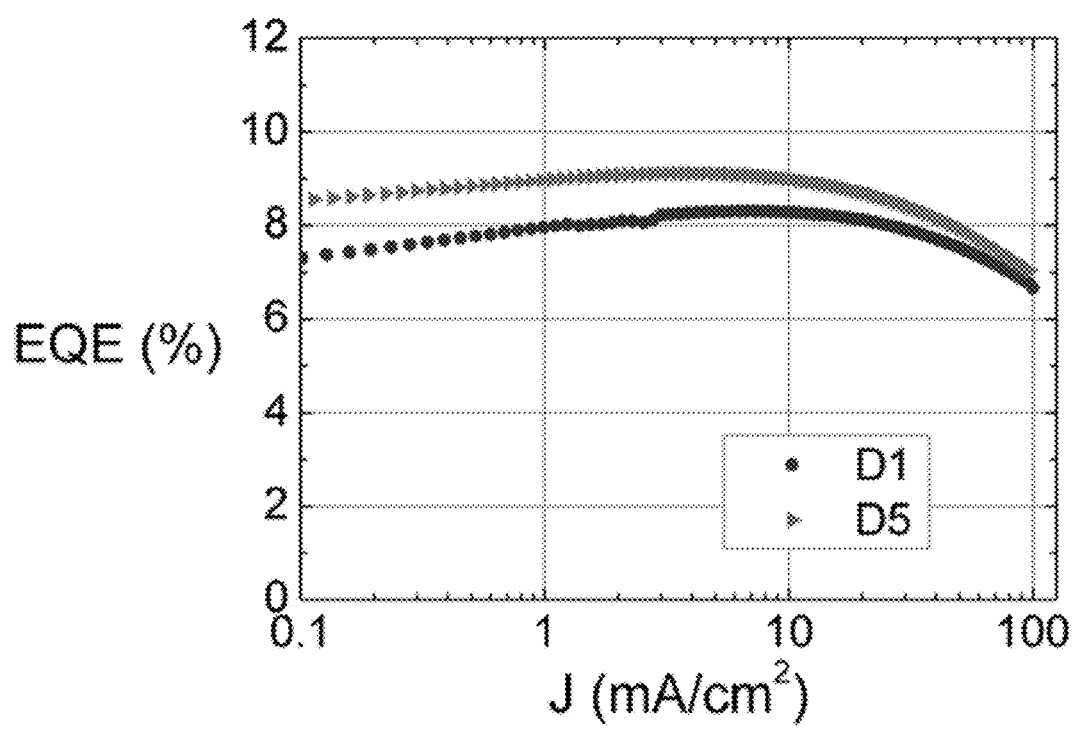
FIG. 11 shows a plot of external quantum efficiency ("EQE") versus current density (mA/cm$^2$) for (i) prior art OLED D1 having device structure ITO/10 nm of Ir(ppy)$_3$/20 nm of NPD/40 nm of blue emissive dopant, Ir(dmp)$_3$, uniformly doped in MCBP at a volume concentration of 15%/5 nm of MCBP/25 nm of Alq$_3$/1 nm of LiF/100 nm Al; (ii) for OLED D5 having device structure ITO/10 nm of Ir(ppy)$_3$ (HIL)/50 nm of blue emissive dopant, Ir(dmp)$_3$ (EML)/5 nm of MCBP/25 nm of Alq$_3$/1 nm of LiF/100 nm, with a concentration gradient of Ir(dmp)$_3$ that varied linearly with position with 20% at the EML/HIL interface, to 10% at the EML/MCBP interface.
Figure 12:
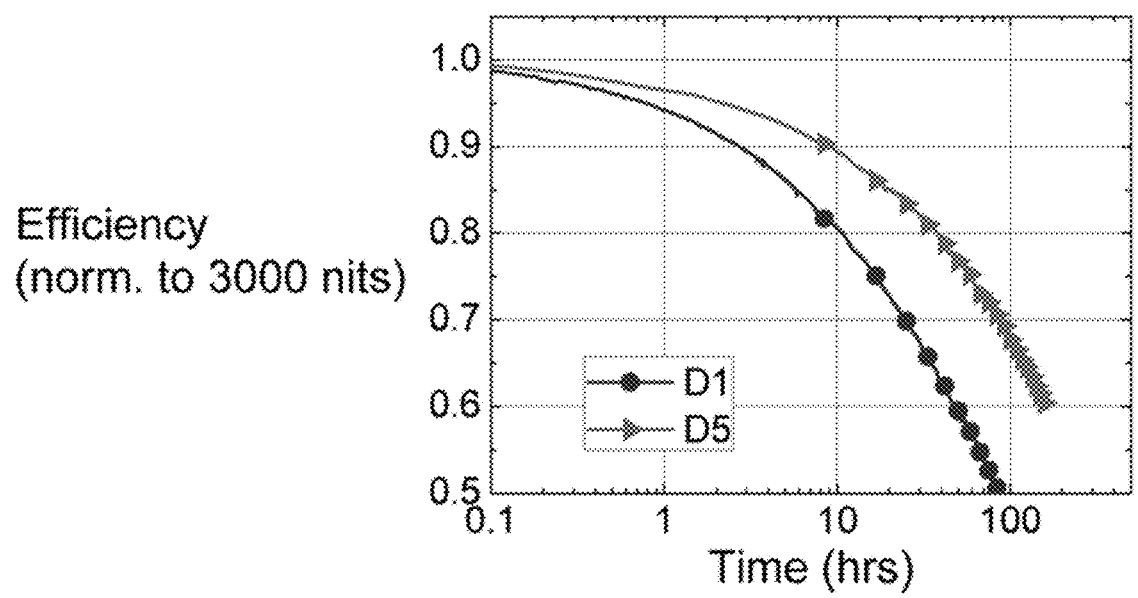
FIG. 12 shows plot of the luminance (normalized to the initial luminance) vs operation time at 70° C. for prior art device D1 and exemplary device D5.
Figure 13:
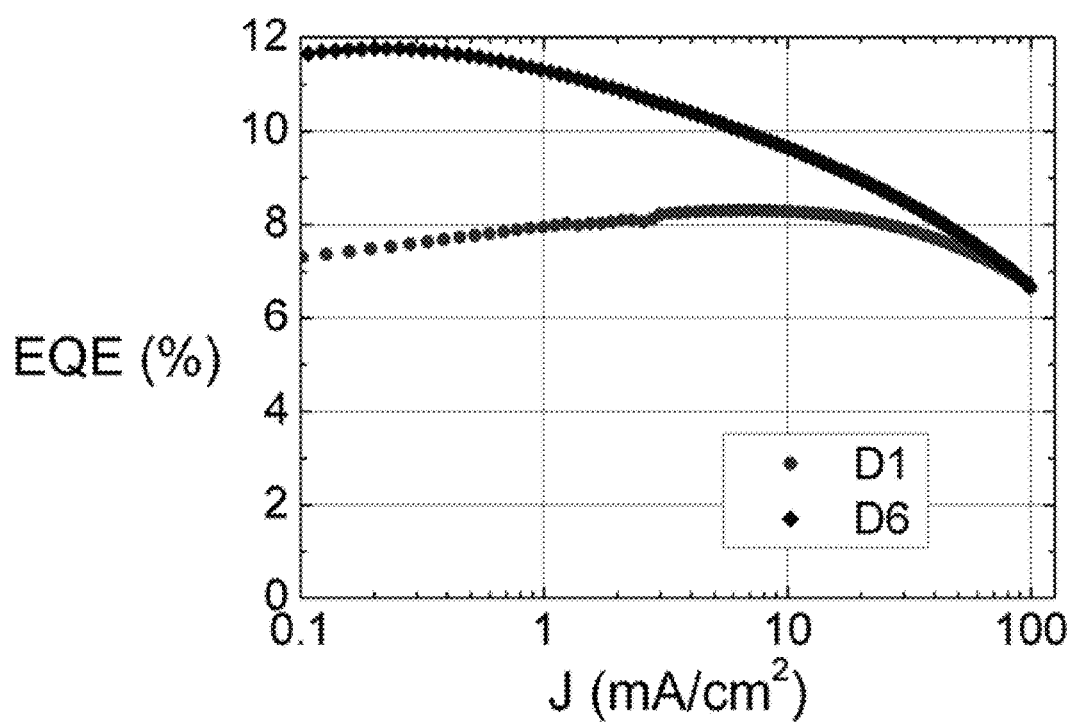
FIG. 13 shows a plot of external quantum efficiency ("EQE") versus current density (mA/cm$^2$) for (i) prior art OLED D1 having device structure ITO/10 nm of Ir(ppy)$_3$/20 nm of NPD/40 nm of blue emissive dopant, Ir(dmp)$_3$, uniformly doped in MCBP at a volume concentration of 15%/5 nm of MCBP/25 nm of Alq$_3$/1 nm of LiF/100 nm Al; (ii) for OLED D6 having device structure ITO/10 nm of Ir(ppy)$_3$ (HIL)/50 nm of blue emissive dopant, Ir(dmp)$_3$ (EML)/5 nm of MCBP/25 nm of Alq$_3$/1 nm of LiF/100 nm, with a concentration gradient where Ir(dmp)$_3$ concentration is uniform at 15% for the first 30 nm, and then three bi-layers (a total of 30 nm) of 5 nm of 3% Ir(dmp)$_3$ concentration and 5 nm of 15% Ir(dmp)$_3$ concentration.
Figure 14:
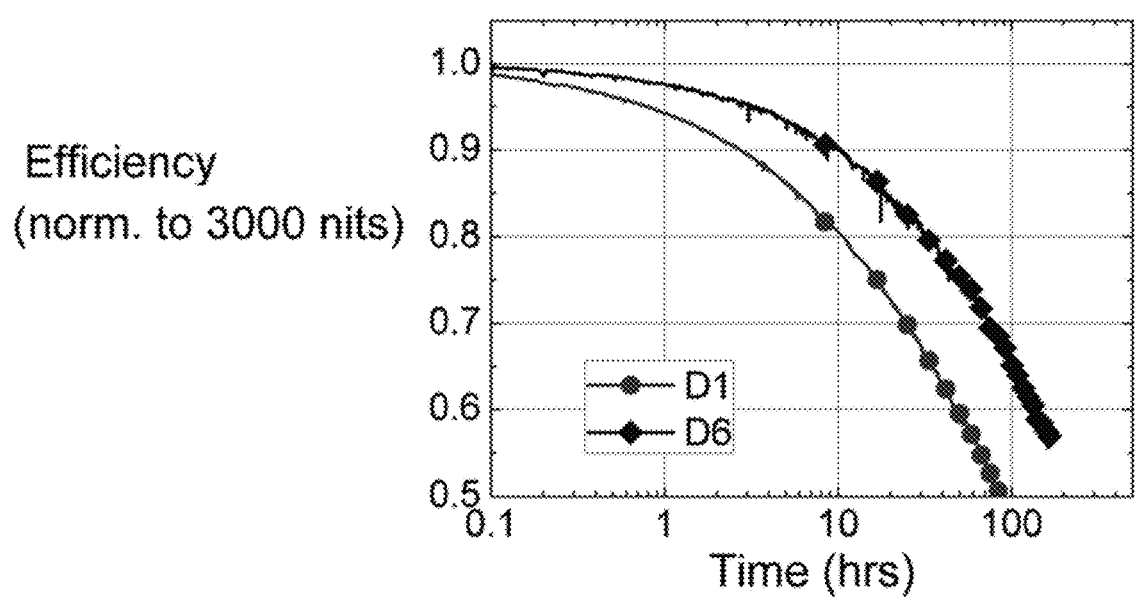
FIG. 14 shows plot of the luminance (normalized to the initial luminance) vs operation time at 70° C. for prior art device D1 and exemplary device D6.
Figure 15:
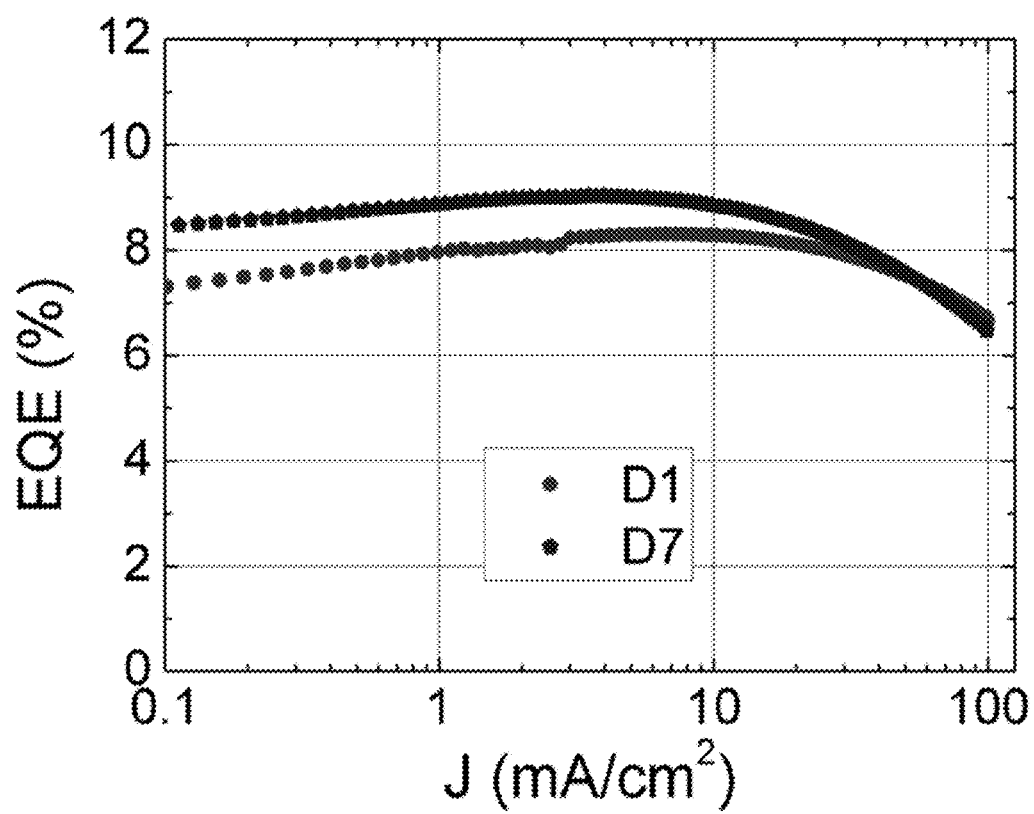
FIG. 15 shows a plot of external quantum efficiency ("EQE") versus current density (mA/cm$^2$) for (i) prior art OLED D1 having device structure ITO/10 nm of Ir(ppy)$_3$/20 nm of NPD/40 nm of blue emissive dopant, Ir(dmp)$_3$, uniformly doped in MCBP at a volume concentration of 15%/5 nm of MCBP/25 nm of Alq$_3$/1 nm of LiF/100 nm Al; (ii) for OLED D7 having device structure ITO/10 nm of Ir(ppy)$_3$ (HIL)/50 nm of blue emissive dopant, Ir(dmp)$_3$ (EML)/5 nm of MCBP/25 nm of Alq$_3$/1 nm of LiF/100 nm, with concentration gradient so starting from the EML/HIL interface, the Ir(dmp)$_3$ concentration is uniform at 15% for the first 30 nm, and then 3 pairs of the following bi-layers with gradually changing Ir(dmp)$_3$ concentrations: 5 nm of Ir(dmp)$_3$ layer with Ir(dmp)$_3$ concentration gradually changed from 15% to 3%, 5 nm of Ir(dmp)$_3$ layer with Ir(dmp)$_3$ concentration gradually changed from 3% to 15%.
Figure 16:
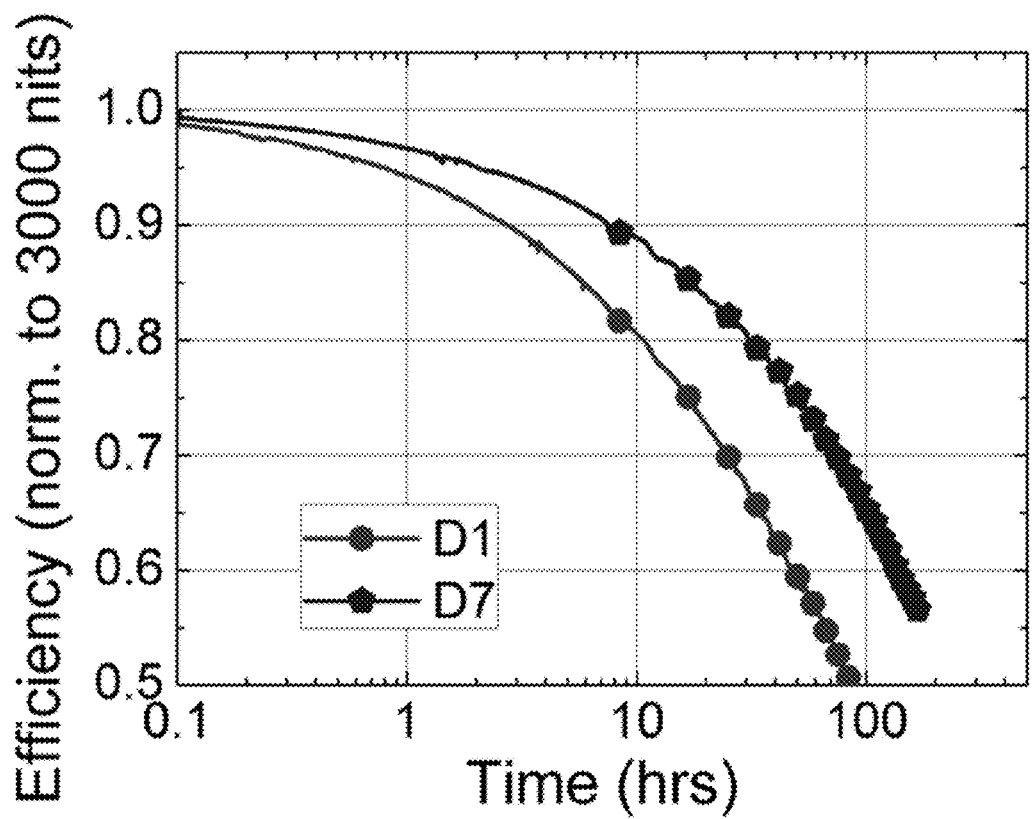
FIG. 16 shows plot of the luminance (normalized to the initial luminance) vs operation time at 70° C. for prior art device D1 and exemplary device D7.

The exciton density profiles in the EMLs are calculated from the emission spectra I(λ), EQEs, and the out-coupling factor in the "probe" devices, we calculate the exciton densities vs. position in the EMLs of D8-D10, with results in FIG. 10. (Celebi, K., Heidel, T. & Baldo, M., Simplified calculation of dipole energy transport in a multilayer stack using dyadic Green's functions, *Optics Express* 15, 1762-1772 (2007). Figure S3 shows representative emission spectra from the devices for the EML employed in D9.

From the peak intensity at a wavelength of λ=466 nm ($I_B$), and the peak minus the emission intensity from a control device at λ=595 nm ($I_R$), then $$r(x) = \frac{N_R^{out}(x)}{N_R^{out}(x) + N_B^{out}(x)}$$

in Eq. (1) can be calculated using $$\frac{N_R^{out}(x)}{N_B^{out}(x)} = \frac{I_R}{I_B} \frac{595 \text{ nm}}{466 \text{ nm}}.$$

Then r(x) is shown in Fig. S4.

Figure 24:
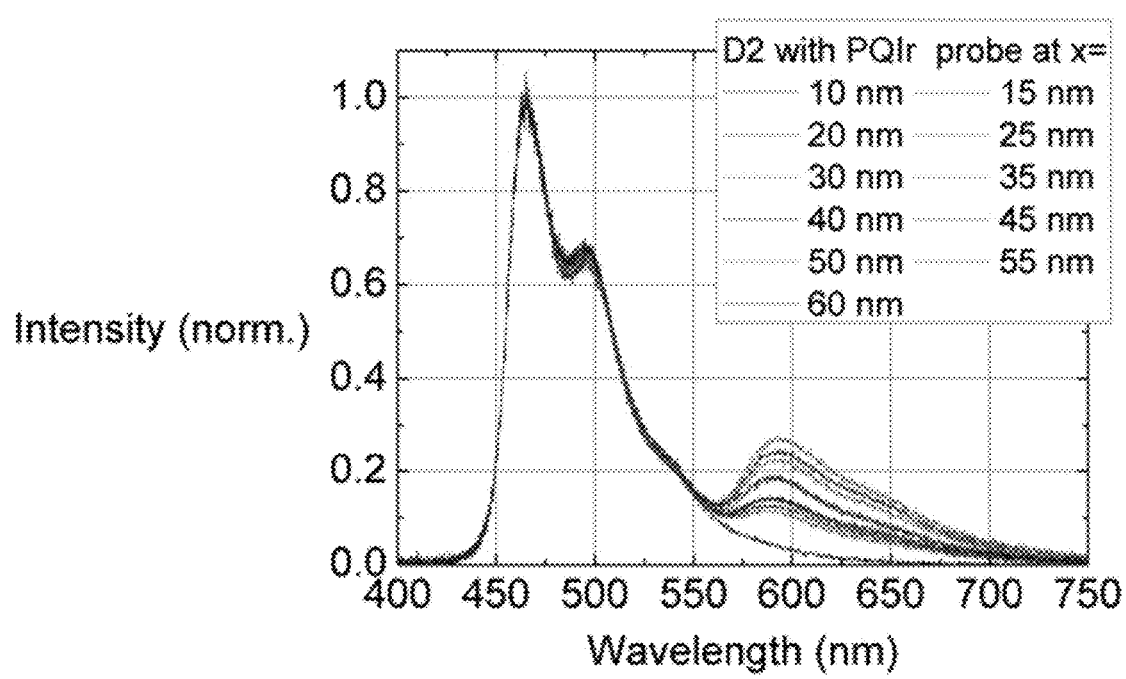
FIG. 24 illustrates emission spectra from probe devices for D9 at J=10 mA/cm².

Also shown in FIG. 24 are the other two terms in Eq. (1), i.e. EQE(x) and $\eta_R(x)$. Note that the errors in x in FIG. 3(b) arise from determination of the Forster transfer radius for Ir(dmp)$_3$ to PQIr of ~3 nm, and the y error bars in FIG. 23b arise from the deviations in EQEs.

Figure 25:
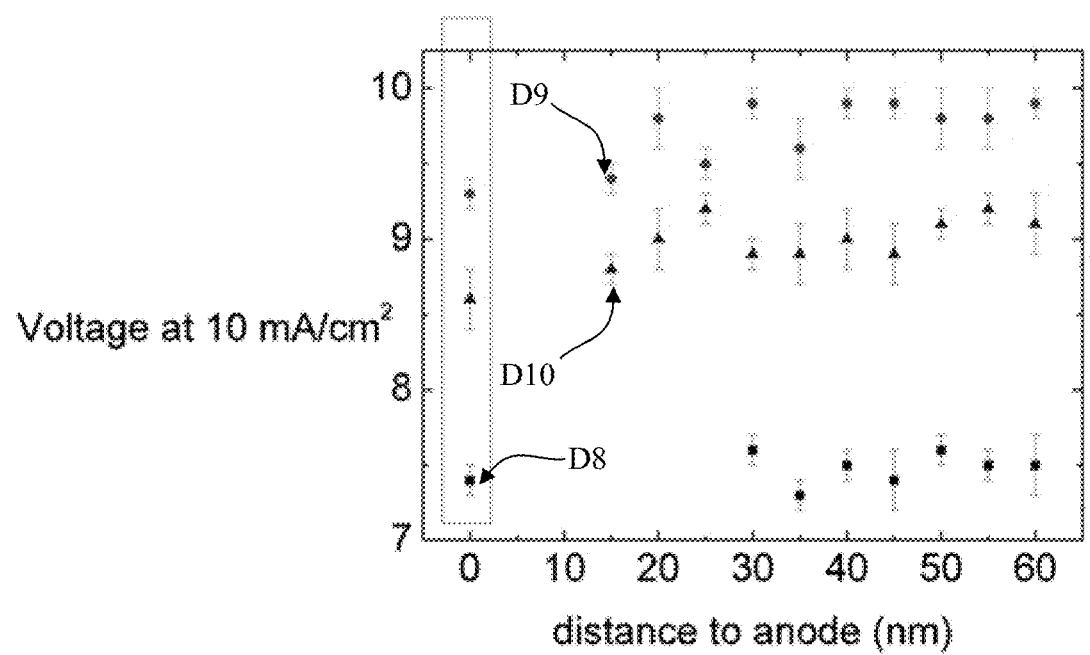
FIG. 25 illustrates operation voltages of the device D8 and devices D9 and D10 with PQIr sensors at 10 mA/cm².

FIG. 25 illustrates the voltage for the sensing devices at 10 mA/cm$^2$ and demonstrates that the voltages are roughly independent of the existence of the PQIr sensor. Thus, the transport and recombination characteristics in the EMLs are expected to be unaffected by the PQIr doping.

In D8 (i.e. the conventional blue PHOLED), significant exciton accumulation occurs at the EML/HBL interface. In D9 where there is no HTL, the exciton density at the HIL/EML interface is reduced due to a correspondingly low concentration of holes. However, because of the reduced hole transport efficiency, electrons penetrate deep into the EML, resulting in a peak exciton density near the HIL/EML interface. In contrast, both efficient hole transport near the HIL/EML interface and the gradual hole blocking in the EML in D10 lead to a more uniform exciton distribution compared to D8 and D9, with a peak density near to the center of the EML. Since the EMLs of D10 and D11 are identical, also shown in FIG. 20, the exciton density profile of D11, estimated at 53% of the exciton density in D10 (at 10 mA/cm$^2$) due to the almost double EQE.

Figure 21A:
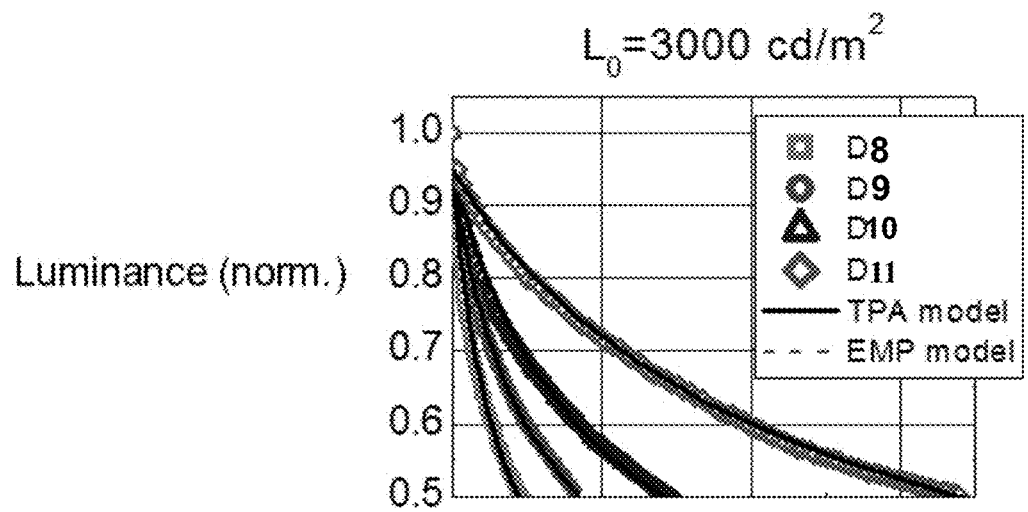
FIG. 21a and FIG. 21b illustrate time evolution of the normalized luminance of blue PHOLEDs and change in operating voltage ΔV (offset to zero) at the initial luminance of L$_0$=3000 cd/m$^2$.
Figure 21B:
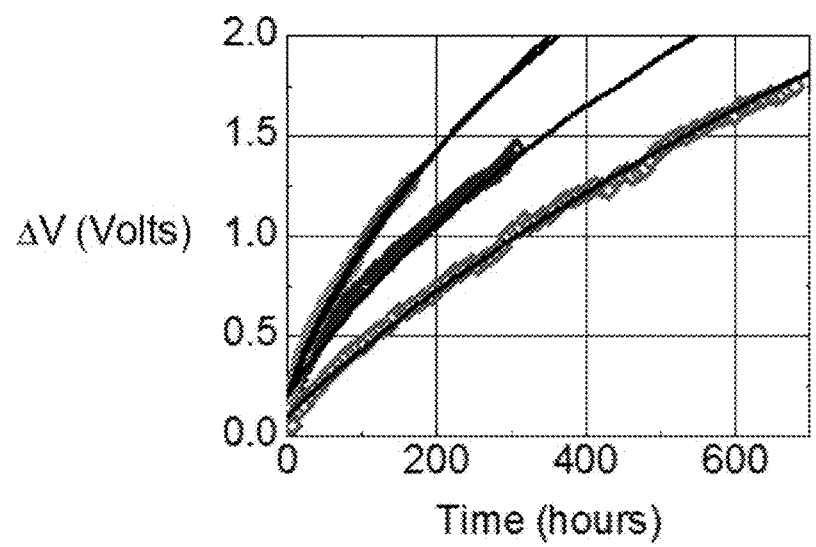
Figure 21C:
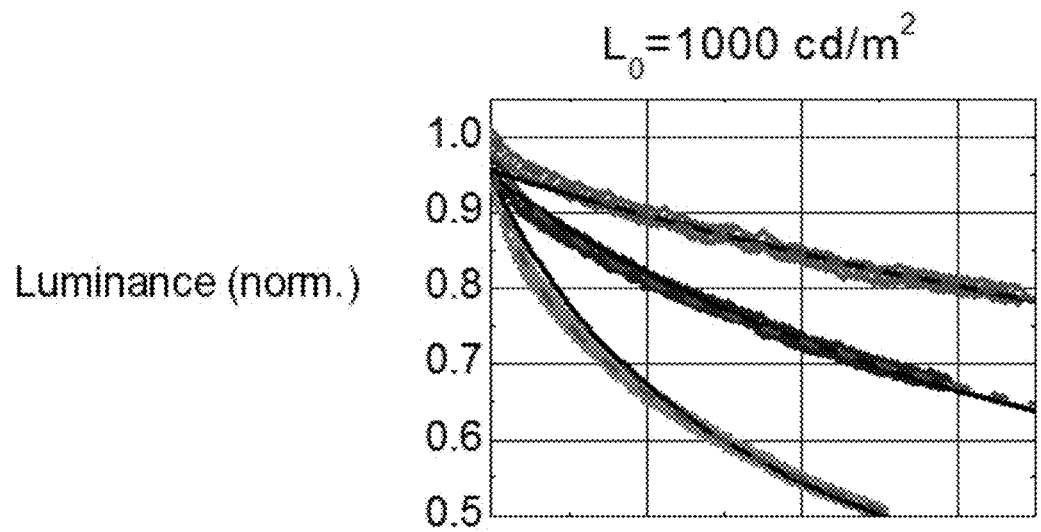
FIG. 21c and FIG. 21d illustrate time evolution of the normalized luminance of blue PHOLEDs and change in operating voltage ΔV (offset to zero) at the initial luminance of 1000 cd/m².
Figure 21D:
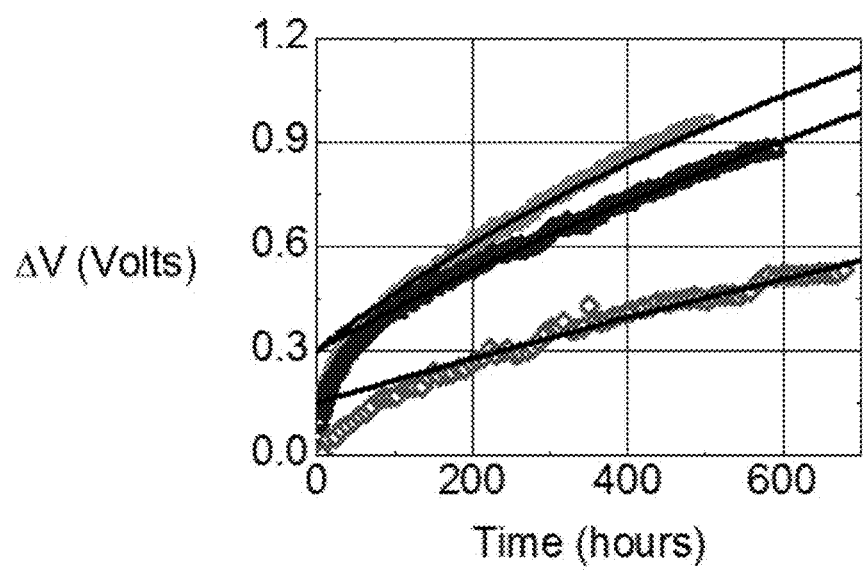

FIGS. 21a-21d shows the time evolution of L and V for D8, D10, and D11 tested at room temperature and a constant current density for two initial luminances: $L_0$=3000 cd/m$^2$ and 1000 cd/m$^2$, respectively. Also, FIGS. 21a-21b illustrate these same characteristics for D9 tested at L=3000 cd/m$^2$. The lifetimes show an increasing trend from D8 through D11. For example, T80=11.5, 24.5, 39, and 106 hr, respectively, for D8-D11 at $L_0$=3000 cd/m$^3$, consistent with the broadened exciton formation zone of the latter two devices FIG. 20. Further, T80=616±10 hr for D11 at $L_0$=1000 cd/m$^2$, representing a more than 10 times improvement from the previously investigated control, D8 (as reported by Giebink, N. C., D'Andrade, B. W., Weaver, M. S., Mackenzie, P. B., Brown, J. J., Thompson, M. E. & Forrest, S. R., Intrinsic luminance loss in phosphorescent small-molecule organic light emitting devices due to bimolecular annihilation reactions, J. Appl. Phys. 103 (2008)). The improvement in T50 for D11 is slightly less significant than T80, leading to an approximately seven-fold increase from D8.

To establish a quantitative relationship between the exciton density profiles and operational lifetime, we model L and V as functions of time, t, following Giebink et al. Intrinsic luminance loss in phosphorescent small-molecule organic light emitting devices due to bimolecular annihilation reactions. Briefly, the degradation of both L and V are attributed to the formation of defects (or traps) in the EMLs due to TPA, at a rate, $k_Q$. The following trap bimolecular interactions are considered: trap-electron annihilation at rate, $k_{Qn}$, =1.44×10$^{-13}$ cm$^3$ s$^{-1}$, trap-hole annihilation at rate, $k_{Qp}$=4.8×10$^{-14}$ cm$^3$ s$^{-1}$, and trap-triplet exciton annihilation at rate, $k_{QN}$ (Giebink, N. C., D'Andrade, B. W., Weaver, M. S., Mackenzie, P. B., Brown, J. J., Thompson, M. E. & Forrest, S. R. Intrinsic luminance loss in phosphorescent small-molecule organic light emitting devices due to bimolecular annihilation reactions. J. Appl. Phys. 103 (2008)). Trap formation depends on the local the exciton density; hence we model PHOLED degradation using the density profiles in FIG. 20. The model is fit to the degradation of D8-D11 with $k_Q$ and $k_{QN}$ as free parameters (Table 1); all other parameters are as previously determined for this materials combination as reported by Giebink, et al.

Water contamination of organic films during deposition leads to an accelerated initial burn-in when the deposition background pressure is above 5×10$^{-8}$ Torr for PHOLEDs almost identical to D1 (Yamamoto, H., Brooks, J., Weaver, M., Brown, J., Murakami, T. & Murata, H. Improved initial drop in operational lifetime of blue phosphorescent organic light emitting device fabricated under ultra high vacuum condition. Applied Physics Letters 99, 033301 (2011)). In our case, organic films were deposited in a system with a base pressure of 5×10$^{-7}$ Torr. However, the TPA model ignores extrinsic effects such as water contamination. Therefore, to account for these effects in our fits, t=0 corresponded to a normalized luminance of 0.95, and the change in voltage from its initial value (i.e. ΔV=|V(t=0)−V(t)|) was chosen to be nonzero (see Methods).

From Table 1, $k_Q$ and $k_{QN}$ in D8 and D9 are almost identical, suggesting that improvement of the operational lifetime from D8 to D9 is simply a result of changes in the exciton density profile. In D10, the significant increase in lifetime is due to the increase in EQE (leading to a decrease of J to achieve a given $L_0$), as well as to the broadening of the exciton formation zone. Note that the TPA model considers degradation in the thin film bulk, but not at the interface as reported by Wang, Q. & Aziz, H. Degradation of Organic/Organic Interfaces in Organic Light-Emitting Devices due to Polaron-Exciton Interactions. ACS Applied Materials & Interfaces 5, 8733-8739 (2013). Indeed, the low exciton density at the EML/HBL interface in D10 may also contribute to the observed increase in lifetime by reducing the rate of damage at this interface.

To estimate T50 at $L_0$=1000 cd/m$^2$ for D10 and D11, we extrapolate the times obtained from the TPA model fits. In addition, an empirical method often employed to model OLED degradation uses the adjusted exponential decay function: L(t)=exp[−(t/τ)$^β$]. (Féry, C., Racine, B., Vaufrey, D., Doyeux, H. & Cinà, S. Physical mechanism responsible for the stretched exponential decay behavior of aging organic light-emitting diodes. Applied Physics Letters 87, -(2005)).

Here, τ and β are phenomenological parameters. This model also results in reasonable fits to the degradation data (FIG. 4 (c)), and provides extrapolated values for T50 similar to those obtained from the physics-based TPA model (Table 1). From these fits, T50=3500 hr at $L_0$=1000 cd/m$^2$ for D11, which approaches that of blue fluorescent OLEDs with T50~10$^4$ hr as reported by Shirota, Y. & Kageyama, H. Charge carrier transporting molecular materials and their applications in devices. Chem. Rev. 107, 953-1010 (2007). Note that D8-D11 are only light blue (although more saturated than the cyan color of FIrpic). However color tuning to achieve more saturated blue emission is commonly achieved in fluorescent blue display sub-pixels through the use of microcavities and/or color filters. (Bulovic, V., Khalfin, V. B., Gu, G., Burrows, P. E., Garbuzov, D. Z. & Forrest, S. R. Weak microcavity effects in organic light-emitting devices. *Phys. Rev. B* 58, 3730-3740 (1998) and Xiang, C., Koo, W., So, F., Sasabe, H. & Kido, J., A systematic study on efficiency enhancements in phosphorescent green, red and blue microcavity organic light emitting devices, *Light: Science & Applications* 2, e74 (2013)). For example, a 70 nm thick anode of indium-tin oxide (ITO) yields CIE coordinates of [0.16, 0.26], and compared to [0.16, 0.31] for a 120 nm thick ITO layer due to weak microcavity effects. (Yamamoto, H., Brooks, J., Weaver, M., Brown, J., Murakami, T. & Murata, H., Improved initial drop in operational lifetime of blue phosphorescent organic light emitting device fabricated under ultra high vacuum condition, *Applied Physics Letters* 99, 033301 (2011)).

Figure 26:
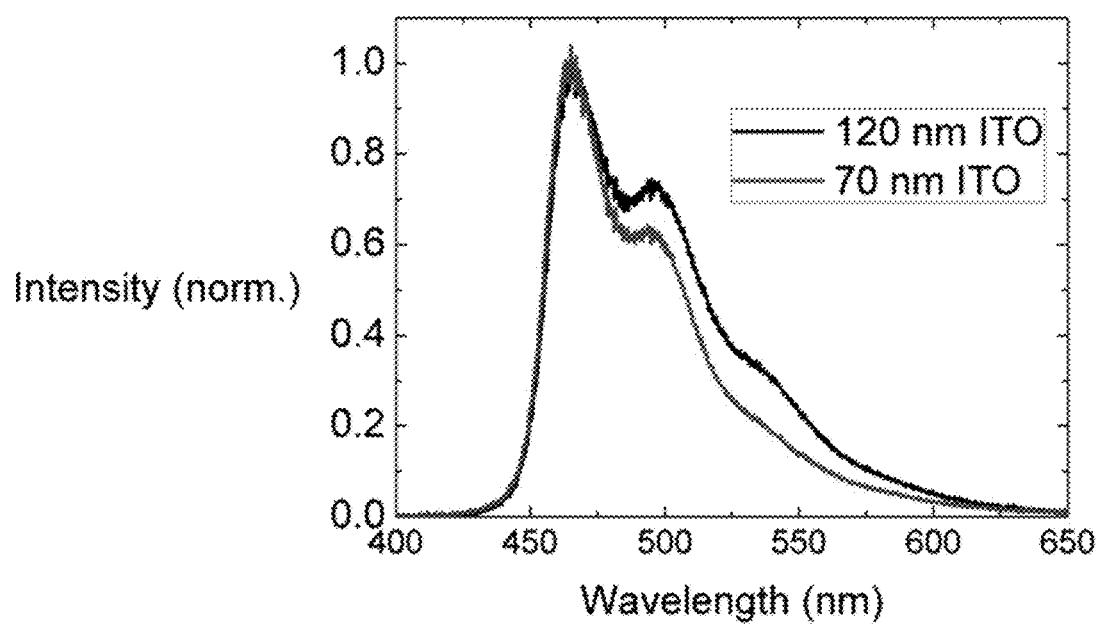
FIG. 26 illustrates emission spectra of D8 on 70 nm and 120 nm thick ITO films on glass.
Figure 27:
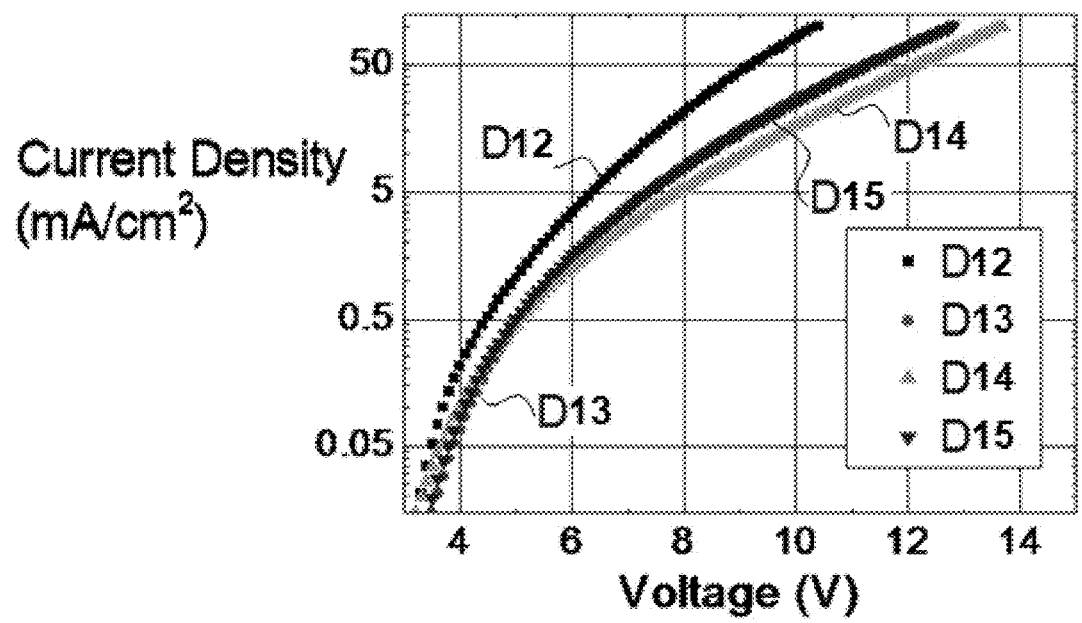
FIG. 27 illustrates a plot of current density (mA/cm²) versus voltage (V) for devices D12-D15.
Figure 28:
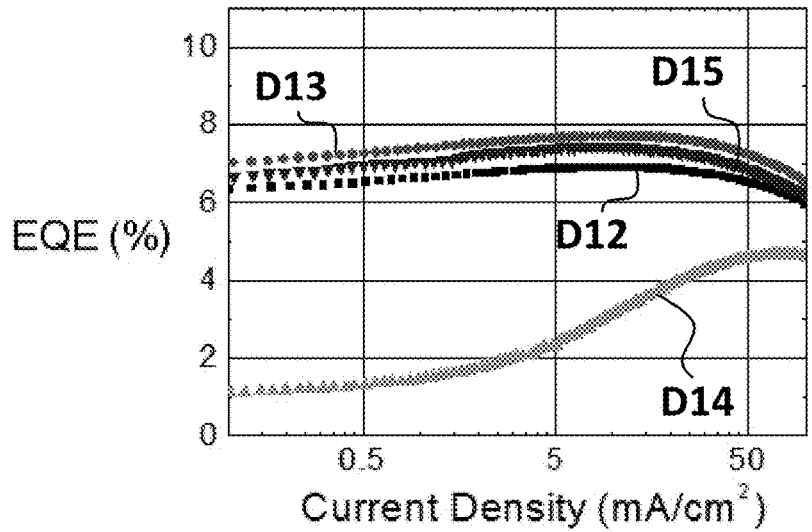
FIG. 28 illustrates a plot of external quantum efficiency versus current density (mA/cm²) for devices D12-D15.
Figure 29:
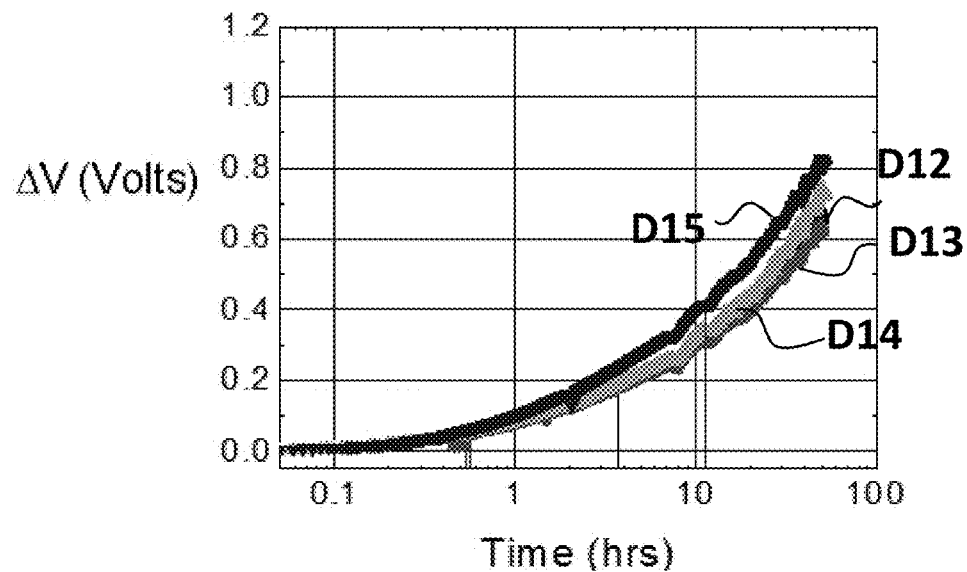
FIG. 29 illustrates a plot of change in voltage with time for devices D12-D15.
Figure 30:
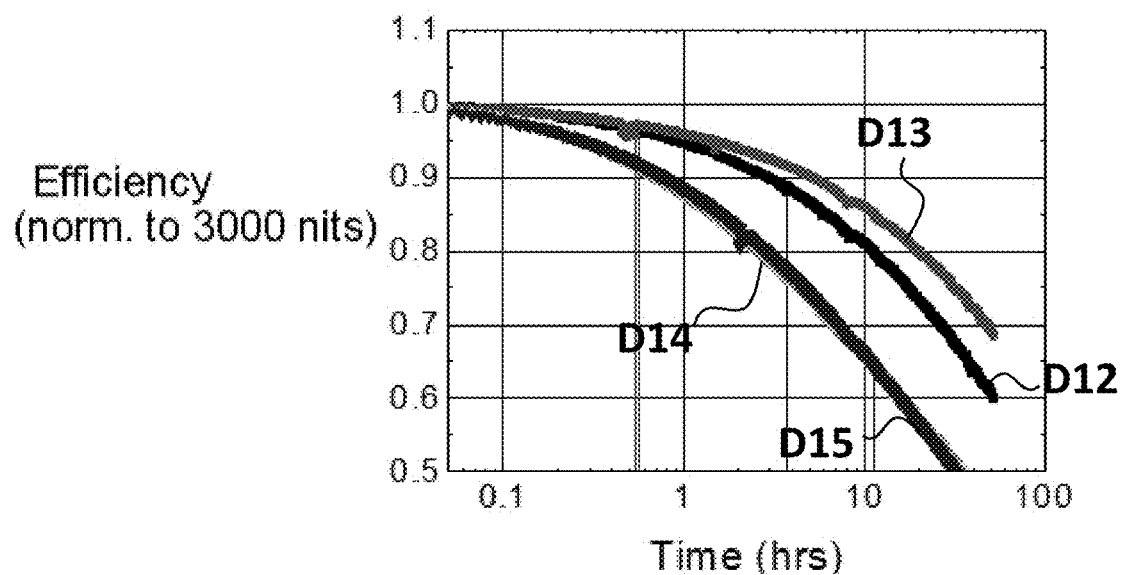
FIG. 30 illustrates a plot of efficiency versus time for devices D12-D15.
Figure 31:
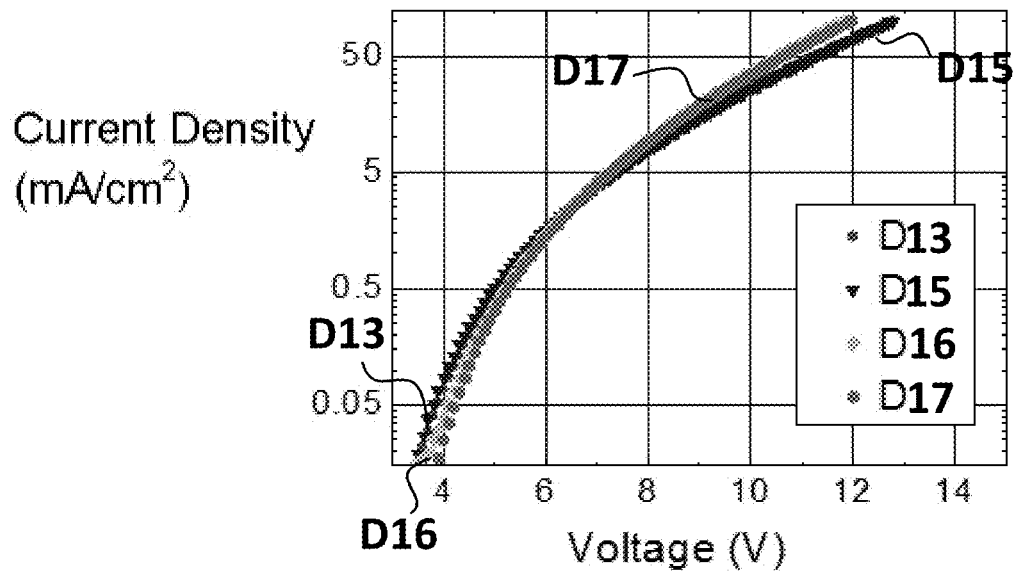
FIG. 31 illustrates a plot of current density (mA/cm²) versus voltage (V) for devices D13, D15, D16 and D17.
Figure 32:
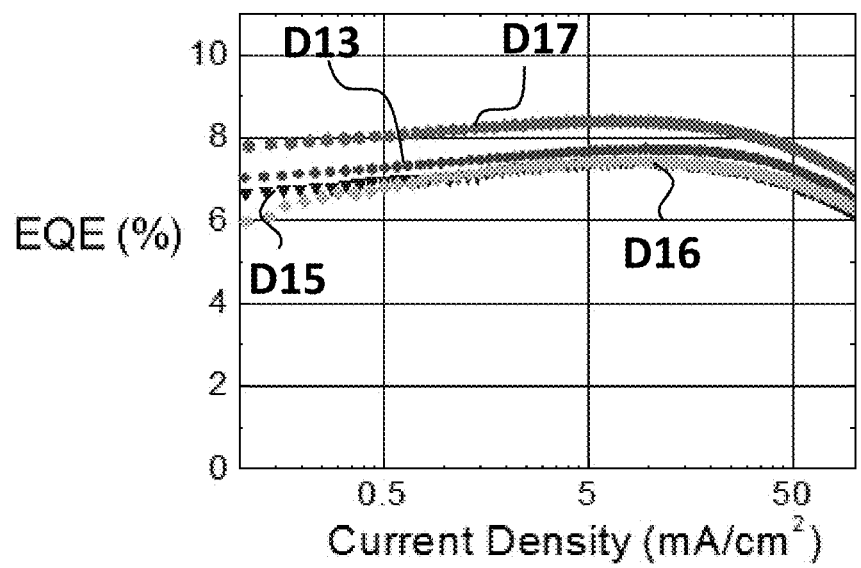
FIG. 32 illustrates a plot of external quantum efficiency versus current density (mA/cm²) for devices D13, D15, D16 and D17.
Figure 33:
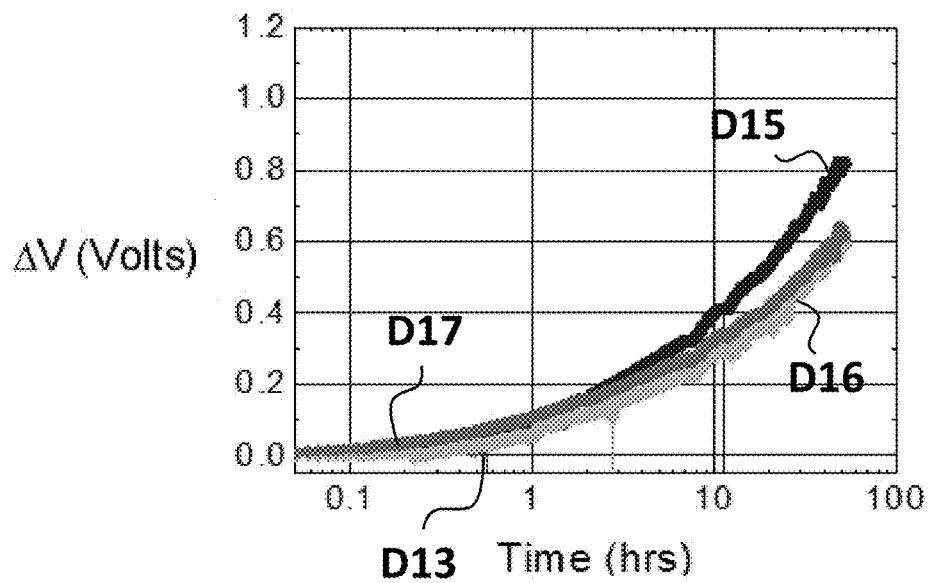
FIG. 33 illustrates a plot of change in voltage with time for devices D13, D15, D16 and D17.
Figure 34:
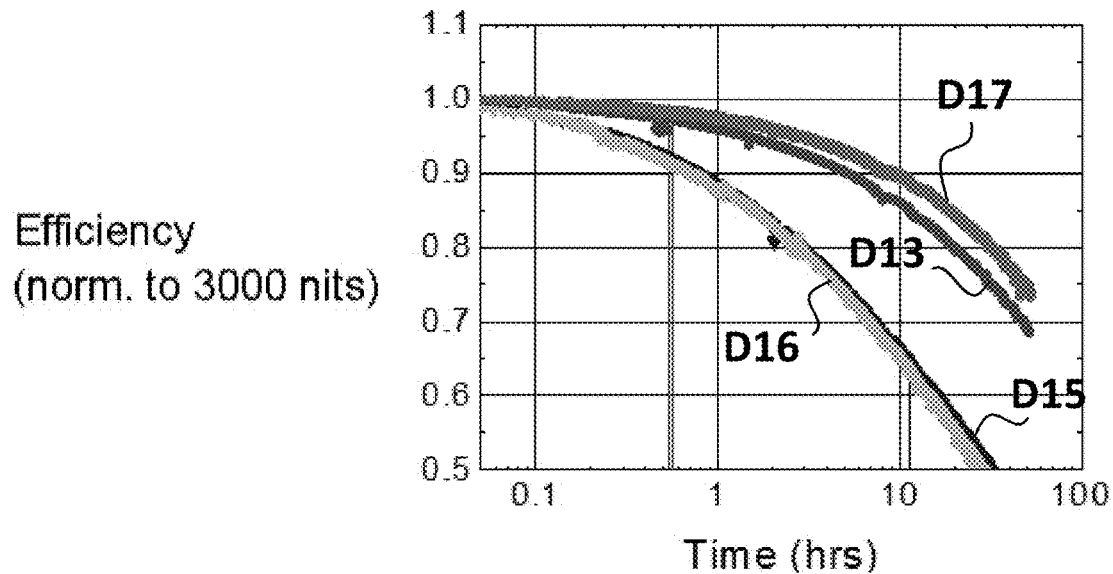
FIG. 34 illustrates a plot of efficiency versus time for devices D13, D15, D16 and D17.

Weak microcavity effects were also observed by comparing the emission spectra of D1 for substrates with ITO thicknesses of 120 nm and 70 nm in FIG. 26. The suppressed emission at long wavelengths, and hence improved blue CIE color coordinates in the 70 nm ITO sample is due to weak microcavity effects.

Local exciton densities N(x) in the EMLs are calculated from the measured emission spectra, external quantum efficiency, EQE(x), and the calculated out-coupling efficiency $\eta_R(x)$ (at a wavelength of 595 nm corresponding to the peak in the PQIr emission spectrum), from PHOLEDs with PQIr sensing layer at position x using:

$$N(x) = A \times EQE(x) \frac{N_R^{out}(x)}{N_R^{out}(x) + N_B^{out}(x)} \frac{1}{\eta_R(x)}.$$

Here, A is a normalization factor such that $\int_{EML} N(x)dx=1$, $N_R^{out}(x)/N_B^{out}(x)$ is the out-coupled photon number ratio from PQIr versus Ir(dmp)$_3$, obtained from the ratio of red and blue peaks of the emission spectra.

The time evolution of L(t) and V(t) was modeled, following Giebink et al., by assuming trap (with density Q(x, t)) formation due to TPA, and subsequent annihilation with electrons with density n(x, t), holes with density p(x, t), and excitons with density N(x, t):

$$G(x) - rn(x, t)p(x, t) - k_{Qn}Q(x, t)n(x, t) = 0 \quad (2)$$

$$G(x) - rn(x, t)p(x, t) - k_{Qn}Q(x, t)p(x, t) = 0$$

$$rn(x, t)p(x, t) - \left(\frac{1}{\tau_N} + k_{QT}Q(x, t)\right)N(x, t) = 0$$

Here $r=1.7\times10^{-13}$ cm$^3$ s$^{-1}$ is the Langevin recombination rate, $\tau_N=1.1$ μs is the triplet lifetime, and G(x) is the local recombination rate, calculated from the local exciton density N(x) using $$G(x) = \frac{J}{e} \frac{N(x)}{\int N(x)dx},$$

where e is the electron charge. Current densities at $L_0=1000$ cd/m$^2$ are provided in Table 1, and at 3000 cd/m$^2$ are J=21, 21, 17.5, and 9.1 mA/cm$^2$ for D8, D9, D10, and D11, respectively. Trap formation is attributed to TPA using:

$$\frac{dQ(x, t)}{dt} = k_Q N(x, t)n(x, t) \quad (3)$$

Then:

$$L(t) = B \int N(x, t)\eta_B(x)dx \quad (4)$$

$$\Delta V(t) = \Delta V(0) + \int \frac{e}{\varepsilon\varepsilon_0} xQ(x, t)dx$$

where B is a normalization factor, $\eta_B$ (x) is the calculated out-coupling efficiency at the peak emission wavelength of 466 nm for Ir(dmp)$_3$, $\epsilon=3$ is the relative permittivity, and $\epsilon_0$ is the vacuum permittivity. To account for the effect of water contamination during device fabrication L(0) is normalized to 0.95 and $\Delta V(0)=0.2$ V (at 3000 cd/m$^2$) and 0.3 V (at 1000 cd/m$^2$) for D8-D10, and 0.1 V (at 3000 cd/m$^2$) and 0.15 V (at 1000 cd/m$^2$) for D11.

Although the blue PHOLED lifetime reported here remains considerably less than that of red and green PHOLEDs at similar luminances, blue sub-pixels in displays operate at a considerably lower luminance than either the red or green sub-pixels. For example, the required luminance to achieve an sRGB color gamut for green is 9.9 times the luminance for blue. (Stokes, M., Anderson, M., Chandrasekar, S. & Motta, R. A standard default color space for the internet-srgb. *Microsoft and Hewlett-Packard Joint Report* (1996)). Thus, a comparison between blue and green PHOLED lifetimes for displays suggests that the blue PHOLED sub-pixel luminance needs to be only ~10% that of the green. Under such conditions (i.e. 100 cd/m$^2$), the TPA model estimate the blue PHOLED lifetime is 70,000 hr. Also, adopting a degradation acceleration factor that relates luminance to lifetime, viz.

$$T50(100 \text{ cd/m}^2) = T50(1000 \text{ cd/m}^2) \times \left[\frac{1000 \text{ cd/m}^2}{100 \text{ cd/m}^2}\right]^n$$

and n=1.55, the extrapolated blue PHOLED lifetime is 1.3×10$^5$ hr. (Féry, C., Racine, B., Vaufrey, D., Doyeux, H. & Cinà, S. Physical mechanism responsible for the stretched exponential decay behavior of aging organic light-emitting diodes. *Applied Physics Letters* 87, -(2005)). This approaches the commercial green PHOLED lifetime (10$^6$ hours) at $L_0=1000$ cd/m$^2$.

In summary, we demonstrate a ten-fold increase in blue PHOLED lifetime employing an extended exciton formation zone achieved by grading the concentration profile of the hole conducting phosphorescent dopant in the EML. Considering the different color sub-pixel luminances used in displays, the improved blue PHOLED lifetimes achieved in stacked devices approaches that of green PHOLEDs under normal operating conditions. The novel device architecture employed is based on a fundamental physical understanding of the relationship between energy-driven triplet-polaron annihilation and device degradation, and hence should be generally applicable to a wide range of phosphorescent and fluorescent devices. Further lifetime improvements are anticipated by finding dopant/host combinations with conduction properties similar to the materials used here, and that minimize interactions between triplets on the dopant and polarons on the host molecules, therefore decreasing the probability of occurrence for high energy TPA interactions that lead to molecular decomposition, and hence loss of luminance over time.

TABLE 1

Characteristics at 1000 cd/m² and lifetime fitting parameters for D1-D4*

| | | $L_0$ = 1000 cd/m² | | | | | TPA model | | Exponential model | |
|---|---|---|---|---|---|---|---|---|---|---|
| | CIE** | EQE (%) | J (mA/cm²) | V (V) | T80 (hr) | T50 (hr) | $k_Q$ (cm³s⁻¹) | $k_{QN}$ (cm³s⁻¹) | T (10³ hr) | β |
| D8 | [0.16, 0.31] | 8.5 ± 0.1 | 6.2 | 6.9 ± 0.2 | 56 ± 3 | 510 ± 15 | (1.0 ± 0.1) × 10⁻¹¹ | (7 ± 1) × 10⁻²⁴ | 1.03 ± 0.01 | 0.54 ± 0.01 |
| D9 | [0.16, 0.31] | 8.5 ± 0.2 | 6.2 | 8.7 ± 0.3 | — | — | (1.1 ± 0.1) × 10⁻¹¹ | (7 ± 1) × 10⁻²⁴ | — | — |
| D1 | [0.16, 0.31] | 9.5 ± 0.1 | 5.7 | 7.7 ± 0.2 | 213 ± 5 | 1500†/ 1600‡ | (0.95 ± 0.1) × 10⁻¹¹ | (6 ± 1) × 10⁻²⁴ | 2.96 ± 0.04 | 0.58 ± 0.01 |
| D1 | [0.15, 0.29] | 18.0 ± 0.2 | 2.9 | 14.3 ± 0.1 | 616 ± 10 | 3500†/ 3700‡ | (0.9 ± 0.1) × 10⁻¹¹ | (7 ± 1) × 10⁻²⁴ | 6.74 ± 0.10 | 0.63 ± 0.01 |

*Errors for EQE and V are standard deviations from at least 6 devices, errors for T80 and T50 are standard deviations from 3 devices, and errors for the model parameters are the 95% confidence interval for fittings
**Measured at 10 mA/cm²
†Estimated from extrapolation using the triplet-polaron annihilation (TPA) model
‡Estimated from extrapolation using the adjusted exponential model

What is claimed:

1. An organic light emitting device comprising:
an anode;
a cathode;
a first emissive layer disposed between the anode and the cathode, the first emissive layer comprising an electron transporting compound and a phosphorescent emissive dopant compound;
wherein the phosphorescent emissive dopant compound is a hole transporter; and
wherein the phosphorescent emissive dopant compound has a concentration gradient, in the emissive layer, wherein the concentration gradient varies according to a profile selected from the group consisting of: (i) linear towards the cathode side of the first emissive layer; (ii) non-linear towards the cathode side of the first emissive layer, wherein said non-linear profile corresponds to a polynomial function selected from the group consisting of a quadratic function, a cubic function, or a higher order function; and (iii) a step wise form.

2. The organic light emitting device of claim 1, wherein when the concentration gradient varies in a step wise form, the phosphorescent emissive dopant compound is dispersed in the emissive layer as a plurality of high concentration dopant regions and as a plurality of low concentration dopant regions.

3. The organic light emitting device of claim 1, wherein when the concentration gradient varies in a step wise form, wherein the phosphorescent emissive dopant compound is dispersed in the emissive layer as a plurality of first dopant regions and as a plurality of second dopant regions, wherein the first dopant regions are wider than the second dopant regions.

4. The organic light emitting device of claim 1, wherein the emissive layer further comprises a second electron transporting compound, wherein the phosphorescent emissive dopant compound has a HOMO energy level at least 0.5 eV lower than a HOMO level of the second electron transporting compound.

5. The organic light emitting device of claim 1, wherein the organic light emitting device further comprises a hole injection layer disposed between the anode and the emissive layer.

6. The organic light emitting device of claim 5, wherein the hole injection layer and the emissive layer have a combined thickness, and wherein the emissive layer has a thickness which is at least 60% of the combined thickness.

7. The organic light emitting device of claim 6, wherein the emissive layer has a thickness ranging from 10 nm to 150 nm.

8. The organic light emitting device of claim 1, wherein a hole injection layer is not disposed between the anode and the emissive layer.

9. The organic light emitting device of claim 1, wherein exciton density is uniformly distributed across the emissive layer compared to an equivalent device that has a uniform concentration of the phosphorescent emissive dopant compound in the emissive layer.

10. The organic light emitting device of claim 1, wherein the concentration gradient decreases from the cathode side of the first emissive layer to the anode side of the emissive layer.

11. The organic light emitting device of claim 1, wherein the concentration gradient increases from the cathode side of the first emissive layer to the anode side of the emissive layer.

12. The organic light emitting device of claim 3, wherein electron transport is performed primarily by the electron transporting compound.

13. The organic light emitting device of claim 5, wherein hole transport is performed primarily by the phosphorescent emissive dopant compound.

14. The organic light emitting device of claim 1, further comprising an electron transport layer disposed between the cathode and the emissive layer.

15. The organic light emitting device of claim 1, wherein the organic light emitting device has an external quantum efficiency of at least 10% higher compared to an equivalent device that has a uniform concentration of the phosphorescent emissive dopant compound in the emissive layer.

16. The organic light emitting device of claim 1, wherein the organic light emitting device exhibits a time to degrade to 80% of an initial luminance value of 1000 cd/m2 that is at least 3.5 times greater than an equivalent device that has a uniform concentration of the phosphorescent emissive dopant compound in the emissive layer.

* * * * *